United States Patent [19]

Lauf et al.

[11] Patent Number: 5,798,395
[45] Date of Patent: Aug. 25, 1998

[54] ADHESIVE BONDING USING VARIABLE FREQUENCY MICROWAVE ENERGY

[75] Inventors: Robert J. Lauf, Oak Ridge; April D. McMillan, Knoxville; Felix L. Paulauskas, Oak Ridge, all of Tenn.; Zakaryae Fathi, Cary; Jianghua Wei, Raleigh, both of N.C.

[73] Assignees: Lambda Technologies Inc., Raleigh, N.C.; Lockheed Martin Energy Research Corporation, Oak Ridge, Tenn.

[21] Appl. No.: 626,207

[22] Filed: Mar. 29, 1996

Related U.S. Application Data

[63] Continuation-in-part of Ser. No. 523,902, Sep. 6, 1995, Pat. No. 5,721,286, which is a continuation-in-part of Ser. No. 221,188, Mar. 31, 1994, abandoned.

[51] Int. Cl.⁶ .................. C09J 5/06; H05B 6/64; B32B 31/28
[52] U.S. Cl. .................. 522/1; 522/3; 522/170; 522/71; 204/157.15; 156/272.4; 156/275.5; 156/275.7; 219/678; 219/750; 219/759
[58] Field of Search .............. 427/508, 514, 427/516, 521, 543, 544, 550, 513; 522/1, 3, 4, 5; 156/272.4, 275.5, 275.7; 219/678, 759, 750

[56] References Cited

U.S. PATENT DOCUMENTS

| | | | |
|---|---|---|---|
| 2,741,402 | 4/1956 | Sayre | 222/215 |
| 3,461,014 | 8/1969 | James | 156/272 |
| 4,196,332 | 4/1980 | MacKay B et al. | 219/10.55 B |
| 4,777,336 | 10/1988 | Asmussen | 219/10.55 |
| 4,781,304 | 11/1988 | Lapeyre | 220/280 |
| 4,961,796 | 10/1990 | Perrin et al. | 156/69 |
| 4,965,408 | 10/1990 | Chapman et al. | 174/35 MS |
| 5,000,981 | 3/1991 | McGarry et al. | 427/44 |
| 5,120,176 | 6/1992 | Bhatia et al. | 412/8 |
| 5,245,151 | 9/1993 | Chamberlain et al. | 219/10.57 |
| 5,296,271 | 3/1994 | Swirbel et al. | 427/493 |
| 5,317,045 | 5/1994 | Clark, Jr. et al. | 523/300 |
| 5,321,222 | 6/1994 | Bible et al. | 219/745 |
| 5,340,649 | 8/1994 | Roeker et al. | 428/344 |

FOREIGN PATENT DOCUMENTS

| | | |
|---|---|---|
| 0 073 250 A1 | 3/1983 | European Pat. Off. . |
| 0 237 657 | 9/1987 | European Pat. Off. . |
| 0 399 599 | 11/1990 | European Pat. Off. . |
| 0 250 159 B1 | 11/1992 | European Pat. Off. . |

(List continued on next page.)

OTHER PUBLICATIONS

D. S. Sypula; *Film Welding by Microwave Heating with Localized Adsorber*, Xerox Disclosure Journal vol. 19, No. 3 (May/Jun. 1994).

R. J. Lauf et al.; *Polymer Curing in a Variable Frequency Microwave Oven*, 28th Microwave Power Symposium (Jul. 1993).

*Conductive polymers speed plastic welding* Eureka 12, No. 11:21 (Nov. 1992).

IBM Technical Disclosure Bulletin; vol. 22, No. 9; Feb. 1980.

Lauf et al, "Polymer Curing in a Variable Frequency Microwave Oven", 28th Microwave Power Symposium, Motreal, CA, Jul. 1993.

*Primary Examiner*—Susan W. Berman
*Attorney, Agent, or Firm*—Myers Bigel Sibley & Sajovec

[57] ABSTRACT

Methods of facilitating the adhesive bonding of various components with variable frequency microwave energy are disclosed. The time required to cure a polymeric adhesive is decreased by placing components to be bonded via the adhesive in a microwave heating apparatus having a multimode cavity and irradiated with microwaves of varying frequencies. Methods of uniformly heating various articles having conductive fibers disposed therein are provided. Microwave energy may be selectively oriented to enter an edge portion of an article having conductive fibers therein. An edge portion of an article having conductive fibers therein may be selectively shielded from microwave energy.

13 Claims, 18 Drawing Sheets

FOREIGN PATENT DOCUMENTS

| | | |
|---|---|---|
| 1 395 646 | 7/1965 | France . |
| 2 093 573 | 1/1972 | France . |
| 2 489 743 | 3/1982 | France . |
| 2 515 096 | 4/1983 | France . |
| 2 555 188 | 5/1985 | France . |
| 40 20 371 C1 | 12/1991 | Germany . |
| 40 36 876 A1 | 5/1992 | Germany . |
| 62-263025 | 11/1987 | Japan . |
| 597666 | 1/1948 | United Kingdom . |
| 2 262 258 | 6/1993 | United Kingdom . |
| WO 95/27387 | 10/1995 | WIPO . |
| WO 97/02725 | 1/1997 | WIPO . |

ADHESIVE BONDING USING VARIABLE FREQUENCY MICROWAVE ENERGY

CROSS REFERENCE TO RELATED APPLICATION

This application is a continuation-in-part of application Ser. No. 08/523,902, filed on Sep. 6, 1995, now U.S. Pat. No. 5,721,286, the disclosure of which is incorporated herein by reference in its entirety and which is a continuation in part of application Ser. No. 08/221,188 filed on Mar. 31, 1994, now abandoned.

This invention was made with U.S. Government support under Contract No. DE-AC05-84OR21400 awarded by the U.S. Department of Energy to Lockheed Martin Energy Systems, Inc. The U.S. Government has certain rights in this invention.

FIELD OF THE INVENTION

This invention relates generally to the curing of polymer adhesives, and more particularly to curing polymer adhesives via variable frequency microwave energy.

BACKGROUND OF THE INVENTION

It is well known that advanced polymer matrix composites have a combination of physical attributes that make them potentially attractive for many applications, particularly where high specific strength and stiffness are needed. Because polymers cannot be easily welded or brazed, adhesive bonding is frequently used to build up a complex assembly from various components. However, one barrier to their widespread use is the long cycle time typically required to cure the adhesive bond necessary to form a strong component.

The application of microwave irradiation decreases the time required to cure some polymers as compared with conventional heating methods. This is because the volumetric deposition of microwave irradiation is more efficient than conduction from the surface resulting from conventional heating techniques. See, for example, *Polymer Curing In A Variable Frequency Microwave Oven*, R. J. Lauf et al., Oak Ridge National Laboratory. See also, U.S. Pat. No. 5,296,271 to Swirbel et al., which proposes a method of curing photoreactive polymers by exposing them to microwave irradiation. Additionally, microwave processing is more economically attractive than conventional heating techniques due to the shorter processing time required to cure the resin. Furthermore, microwave heating enhances polymerization kinetics in some systems, as discussed by D. A. Lewis, et al., "Accelerated Imidization Reactions Using Microwave Radiation," *J. Polymer Sci.: Part A: Polymer Chem.*, Vol. 30, 1647-1653 (1992).

The use of microwave irradiation to cure polymers, however, is not without limitations. Microwave furnaces typically produce microwave energy at a fixed operating frequency. Quite common is a magnetron, which operates at 2.45 gigahertz (GHz), an efficient frequency for heating water. Ovens operating at 2.45 GHz are used for cooking foods, drying, and other purposes wherein the principal material to be acted upon is water. Unfortunately, 2.45 GHz is not the optimum frequency for curing many polymeric materials. Consequently, decreasing the time to cure may not always be achieved at a single frequency.

In addition, quality control and other reliability problems arise when fixed frequency microwave irradiation is used to process multiple workpieces (workpiece is generically used hereinafter to refer to two or more components joined together by polymeric adhesives and subjected to microwave processing). Unless each subsequent workpiece to be irradiated is placed in substantially the same orientation and in substantially the same location within the microwave furnace as the first workpiece, the time required to cure, as well as the quality of the cure, will typically vary because of the inherent nonuniform distribution of electromagnetic energy inside microwave furnaces powered with fixed frequency microwave signals. Additionally, a particular fixed frequency may properly cure the adhesive being used to secure a component to a substrate, but the frequency may cause damage to the components being joined as a result of localized heating or arcing.

Microwave radiation can be effectively blocked by layers of conductive materials such as sheet metal or laminates containing conductive fibers. A unidirectional composite can in general be penetrated by microwaves provided the polarization of the microwave is carefully matched to the fiber orientation. However, in a multidirectional composite, at most, some of the plies would satisfy this condition, and the other plies would effectively block the microwave energy from further penetration into the workpiece. Consequently, polymeric adhesives for joining components comprising carbon fiber composites can be somewhat difficult to cure with microwave radiation.

Fixed frequency microwave ovens typically have cold and hot spots therein. These hot and cold spots are related to the ratio of the microwave wavelength to the size of the oven cavity. When a relatively low frequency microwave is introduced into a small cavity, standing waves typically occur which create hot and cold spots. In extreme cases, a fixed frequency oven cavity may become a "single mode" cavity resulting in multiple cold spots and a small hot spot. Non-uniformity within the cavity leads to non-uniform curing of polymeric material. A workpiece placed within the cavity may have portions properly cured at a hot spot, and not cured at all at a cold spot. For some polymeric materials, catastrophic thermal runaway may result.

Attempts have been made at mode stirring, or randomly deflecting the microwave "beam", in order to break up standing waves and thereby fill the cavity with microwave radiation. One such attempt involves the addition of rotating fan blades at the beam entrance into the cavity. Unfortunately, this approach is limited by the size of the mechanical perturbation, and the speed at which the fan blades can be rotated. In addition, this approach may not create sufficient mode plurality to assure microwave penetration into workpieces of varied shapes and sizes.

Another method used to overcome the adverse effects of standing waves is to create a standing wave within a single-mode cavity such that the workpiece may be placed at the location determined to have the highest power (the hot spot). Thus, only the portion of the cavity in which the standing wave is most concentrated will be used. This poses a serious limitation insofar as only a small volume of material can be processed at one time.

Frequency sweeping as a means of mode stirring was disclosed in the above-referenced U.S. Pat. No. 5,721,286. Frequency sweeping may be performed at a high rate of speed, thereby creating a more uniform time-averaged power density throughout the furnace cavity. Frequency sweeping may be accomplished through the use of a variety of microwave electron devices. A helix traveling wave tube, or TWT, for example, allows the sweeping to cover a broad bandwidth (e.g., 2 to 8 GHz) compared to devices such as a voltage tunable magnetron (2.45±0.05 GHz).

SUMMARY OF THE INVENTION

It is therefore an object of the present invention to reduce the curing time of polymeric adhesives used to join various components together.

It is another object of the present invention to provide uniform curing of polymeric adhesives via microwave radiation.

It is another object of the present invention to provide selective curing of polymeric materials.

It is another object of the present invention to provide rapid and uniform curing of polymeric adhesives used to join multi-layered composite components together.

These and other objects are accomplished, according to the present invention, by various methods of adhesively bonding various components. A polymeric adhesive is applied to an interface between the surfaces of two or more components to be joined. The assembly is placed in a microwave heating apparatus having a multimode cavity and irradiated with microwaves of varying frequencies. The microwave frequencies define a bandwidth of at least five percent of a center frequency, whereby a plurality of independent microwave modes are established within the multimode cavity. The plurality of modes are sufficient to allow microwave power to penetrate the interface, thereby heating the adhesive to decrease the time to cure.

Many different component materials and configurations may be utilized. For example, the components may be comprised of metal alloys, may be polymeric, or may be a mixture of the two. The components may be substantially planar sheets, at least one of which is metal, and wherein the surface to be bonded defines a lap joint. The present invention may be used to process a batch of similar components. The plurality of microwave modes created is sufficient to create a substantially uniform time-averaged power density throughout a batch of components or articles to be bonded together. To facilitate continuous processing in "assembly-line" fashion, the multimode cavity utilized may comprise an open-ended applicator. The open end can be placed upon the metal surface of components passing therebelow to form a wall of the applicator cavity.

The polymeric adhesive may be a thermosetting resin and, in particular, may be a material selected from the group consisting of phenolics, amines, epoxies, silicones, urethanes, polyesters, cyanoacrylate, urea/formaldehyde, acrylics, polyolefins, polyamides, nitrites, polyimides and polysulfides. The polymeric adhesive may also be selected from the group consisting of thermoplastic and elastomeric polymers. In particular, the thermoplastic polymer adhesive may comprise a material selected from the group consisting of polyvinyl acetate, polyvinyl alcohol, polyolefins, polyamides, acrylics, resin emulsions, styrene-based rubbers, nitrile, neoprene and polyimides. Additives may be mixed with the polymeric adhesive to enhance the absorption of microwave energy by the adhesive. Such additives may be in powder form, and may be selected from the group consisting of metals, metal oxides, metal carbides, and carbon black.

The microwave furnace may include a microwave source selected from the group consisting of traveling wave tubes, klystrons, twystrons, gyrotrons, crossed field amplifiers, and frequency agile coaxial magnetrons. The microwave source may have a useful bandwidth of at least five percent of a center frequency. The multimode cavity may include a device for applying a compressive force to the interface of components being joined during the application of microwave energy.

According to another aspect of the present invention, a method of uniformly heating a first substrate having a plurality of first conductive fibers disposed therein in a first direction and having an edge portion generally parallel with the first direction, is provided. A second substrate edge portion is positioned in contacting relation with the first substrate edge portion. The second substrate has a plurality of second conductive fibers disposed therein in a second direction, and is positioned such that the second fibers are substantially perpendicular to the first fibers. The first and second substrates are then exposed to microwave energy to uniformly heat the first substrate. The step of exposing the substrates to microwave energy may comprise sweeping the substrates with variable frequency microwave energy. The substrates may be formed of polymeric material, and the conductive fibers may be formed of graphite.

According to another aspect of the present invention, a method of uniformly heating an article having a plurality of conductive fibers disposed therein and having an end portion exposed along a portion of the article is provided. The exposed fiber end portions are shielded with microwave impermeable material prior to exposing the article to microwave energy to uniformly heat said article. The article may be formed of polymeric material and the conductive fibers may be formed of graphite. The microwave impermeable material may be metallic. The step of exposing the article to microwave energy may comprise sweeping the article with variable frequency microwave energy.

According to another aspect of the present invention, a method of uniformly heating a composite article comprising first and second layers having unidirectional conductive fibers therein is provided. The first layer has a plurality of first conductive fibers disposed therein in a first direction. The second layer has a plurality of second conductive fibers disposed therein in a second direction. The second direction is substantially transverse to the first direction. The article has at least one edge portion substantially perpendicular to the second direction and the article is swept with variable frequency microwave energy to generate an electric field substantially perpendicular to the second direction. The layers may be formed of polymeric material and the conductive fibers may be formed of graphite.

DETAILED DESCRIPTION OF PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
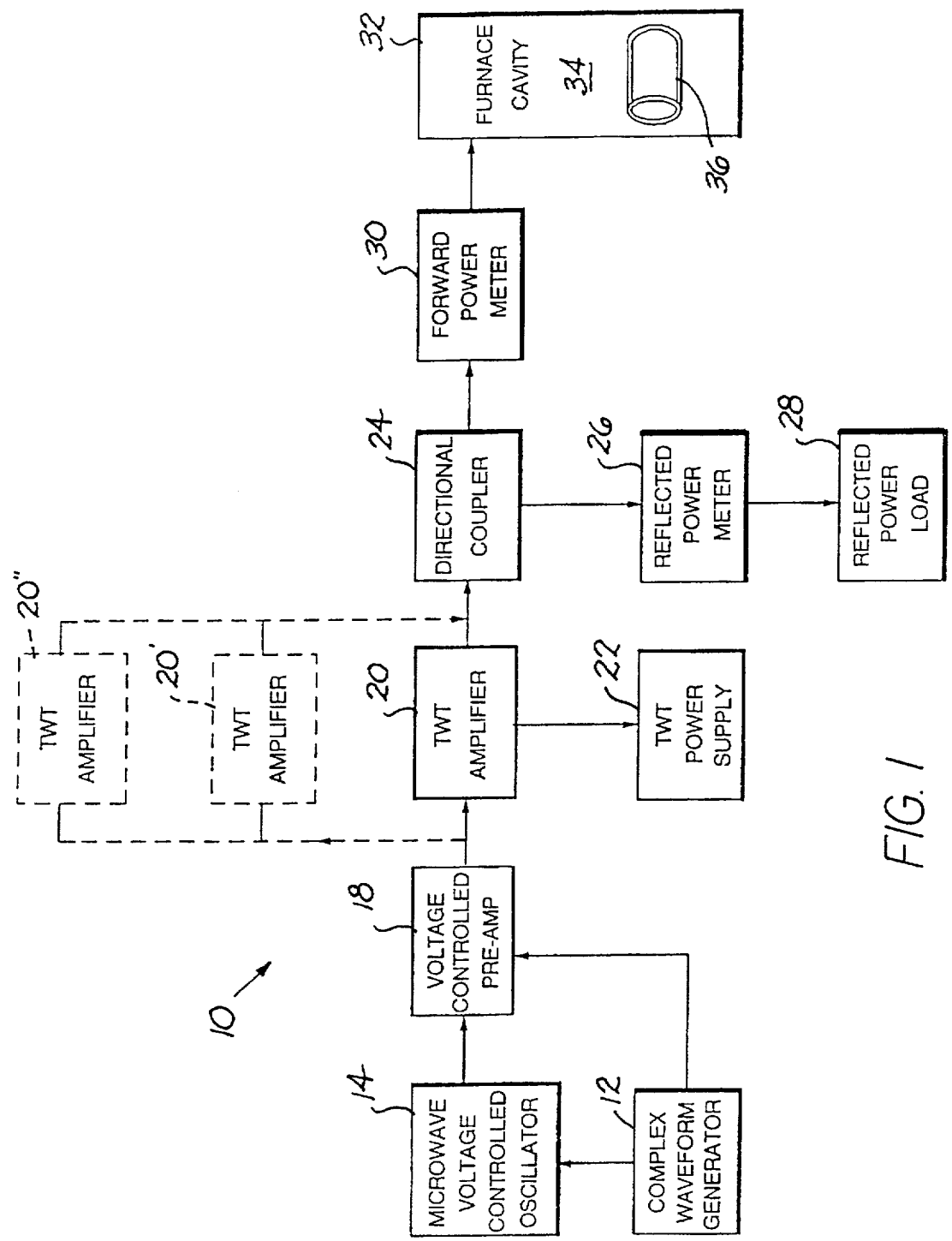
FIG. 1 schematically illustrates an embodiment of the variable frequency microwave heating apparatus, according to the present invention.

Referring now to FIG. 1, a variable frequency microwave heating apparatus 10, according to the present invention, will be described. The microwave heating apparatus 10 preferably allows modulation of the frequency of microwaves introduced into a microwave cavity 34 for testing or other selected applications. Frequency modulation is useful in determining the most efficient frequencies at which a particular material can be processed. Frequency modulation is also useful as a method of mode stirring as a means to create a more uniform power distribution in a relatively small furnace cavity and to assure a large number of independent microwave modes.

Still referring to FIG. 1, a workpiece 36 to be processed is contained within the furnace cavity 34. It will be understood that the term "workpiece", as used herein, refers to a selected material or composition of materials having at least one surface to be adhesively bonded to another surface.

A microwave voltage-controlled oscillator 14 is provided for generating a low-power microwave signal for input to the microwave furnace 32. A complex wave form generator 12 provides the controlling voltage to the voltage-controlled oscillator 14, causing the voltage-controlled oscillator to sweep a given range of frequencies, operate in pulse mode, modulate the frequency of the microwave signal, and produce various complex wave forms. The complex wave form generator 12 may be operated in pulse mode using an internal pulse generator or it can be pulsed externally. An internal modulator is provided for wide band modulation. The internal modulator may operate in amplitude modulated (AM) mode or in frequency modulated (FM) mode.

The microwave voltage controlled oscillator 14 generates a microwave signal of a frequency determined by the voltage applied to the voltage controlled oscillator by the wave form generator 12. Microwave frequency modulation may be necessary because a particular material may efficiently couple with a particular frequency and thus require a high voltage level; whereas, another material may couple more efficiently at a different frequency and at a lower or higher voltage level. The term "couple" as used herein refers to microwave absorption or dissipation. Thus, the microwave voltage controlled oscillator 14 may be used in combination with the complex wave form generator 12 to modify the frequency of the generated microwave.

The number of possible combinations of frequencies and power levels is numerous. Further, with the ability to modulate frequency and amplitude, the processing of a workpiece 36 may be accomplished by alternating microwave frequency and amplitude in order to achieve maximum processing efficiency. Preferably, the modulations occur at a high rate so as to be undetectable by the workpiece 36, yet creating maximum processing efficiency for each material and material phase.

Preferably, a pre-amplifier 18 is provided to amplify the power of the signal output from the microwave voltage-controlled oscillator 14. The pre-amplifier 18 is voltage-controlled, therefore the gain is adjustable such that the magnitude of the output is selectable by the operator. During operation of the variable frequency microwave heating apparatus 10, the operator may instantaneously adjust the pre-amplifier 18 such that the amplitude of the microwave may be correspondingly adjusted. The control voltage for the pre-amplifier 18 can also be supplied by the complex waveform generator 12, allowing the amplitude of the signal output to be modulated as desired.

An amplifier 20 is provided for processing the signal output by the pre-amplifier 18, or from the microwave voltage-controlled oscillator 14 when a pre-amplifier is not employed. The amplifier 20 supplies the microwave signal to the multimode furnace cavity 34 and to which the workpiece 36 is subjected. Preferably, the amplifier 20 may be a helix traveling-wave tube (TWT), a coupled-cavity TWT, a ring-loop TWT, a ring-bar TWT, a klystron, a twystron, or a gyrotron. In the illustrated embodiment, the amplifier 20 is a TWT amplifier. Hereinafter, the amplifier 20 will be referred to as a TWT amplifier, for ease of reference. However, it is understood that the amplifier 20 is not limited to a TWT. Preferably, the microwave source generates microwave energy with a bandwidth of at least five percent (5%) on either side of a particular frequency.

In order to obtain a frequency higher or lower than the range available from the TWT amplifier 20, it is preferable to provide more than one TWT amplifier. As illustrated in FIG. 1, two additional TWT amplifiers 20' and 20" are provided, each having a predetermined frequency range different from the other. One TWT amplifier 20 may define a frequency range of 4 GHz to 8 GHz, while another TWT amplifier 20' defines a frequency range of 8 GHz to 16 GHz. Still another TWT amplifier 20'" may define a third frequency range. Interchanging TWT amplifier 20 with TWT amplifier 20' defines a total range from 4 GHz to 16 GHz. Various configurations of TWT amplifiers 20 are possible such that a broad range of frequencies may be achieved.

Preferably, the TWT amplifiers 20.20'.20" are removable from the variable frequency microwave heating apparatus 10 and interchangeable with other TWT amplifiers. A single microwave voltage-controlled oscillator 14, microwave furnace 32, and microwave furnace cavity 34 may be used with a variety of TWT amplifiers, thus allowing a series of identical tests to be performed with the microwave frequency being substantially the only variable. A power supply 22 is provided for the operation of the TWT amplifier 20. Preferably, the power supply 22 is a direct current source having a precision-regulated cathode power supply and a less-regulated collector high voltage supply.

A directional coupler 24 is provided for detecting the direction of a signal and for directing the signal, depending on the detected direction. Preferably, the directional coupler 24 is located near the collator end of the TWT amplifier 20. A signal received from the TWT amplifier 20 is directed towards the microwave cavity 34. A signal received from the direction of the microwave cavity 34 is directed towards a reflected power load 28. The directional coupler 24 thus provides a means whereby a reflected signal (i.e., power not absorbed by the workpiece 36 and directed back toward the source) is diverted away from the TWT amplifier 20 in order to protect the TWT amplifier from power unabsorbed by the workpiece.

The signal output by the TWT amplifier 20 is introduced into the microwave cavity 34 for absorption by the selected workpiece 36. Typically, the introduced signal is not completely absorbed by the workpiece 36 and is therefore reflected back toward the TWT amplifier 20, having no other path to follow. A forward power meter 30 is provided for measuring the power delivered to the microwave cavity 34. The forward power meter 30 is used in conjunction with a reflected power meter 26 configured to measure reflected power from the microwave cavity 34. The reflected power meter 26 monitors the efficiency of the microwave cavity 34 for the purpose of insuring that reflected power is dissipated in the reflected power load 28 and not by the TWT amplifier 20. The magnitude of the reflected power is detected by the reflected power meter 26. This magnitude is used to determine the efficiency of the instant frequency of the microwave introduced into the microwave cavity 34. A lower reflected power will indicate a more efficient operating frequency due to the higher absorption rate of the selected workpiece 36.

A reflected signal, upon reaching the directional coupler 24, is diverted towards the reflected power meter 26 and then to the reflected power load 28. The reflected power is dissipated in the reflected power band 28, in order to protect the longevity of the TWT amplifier 20.

Figure 2:
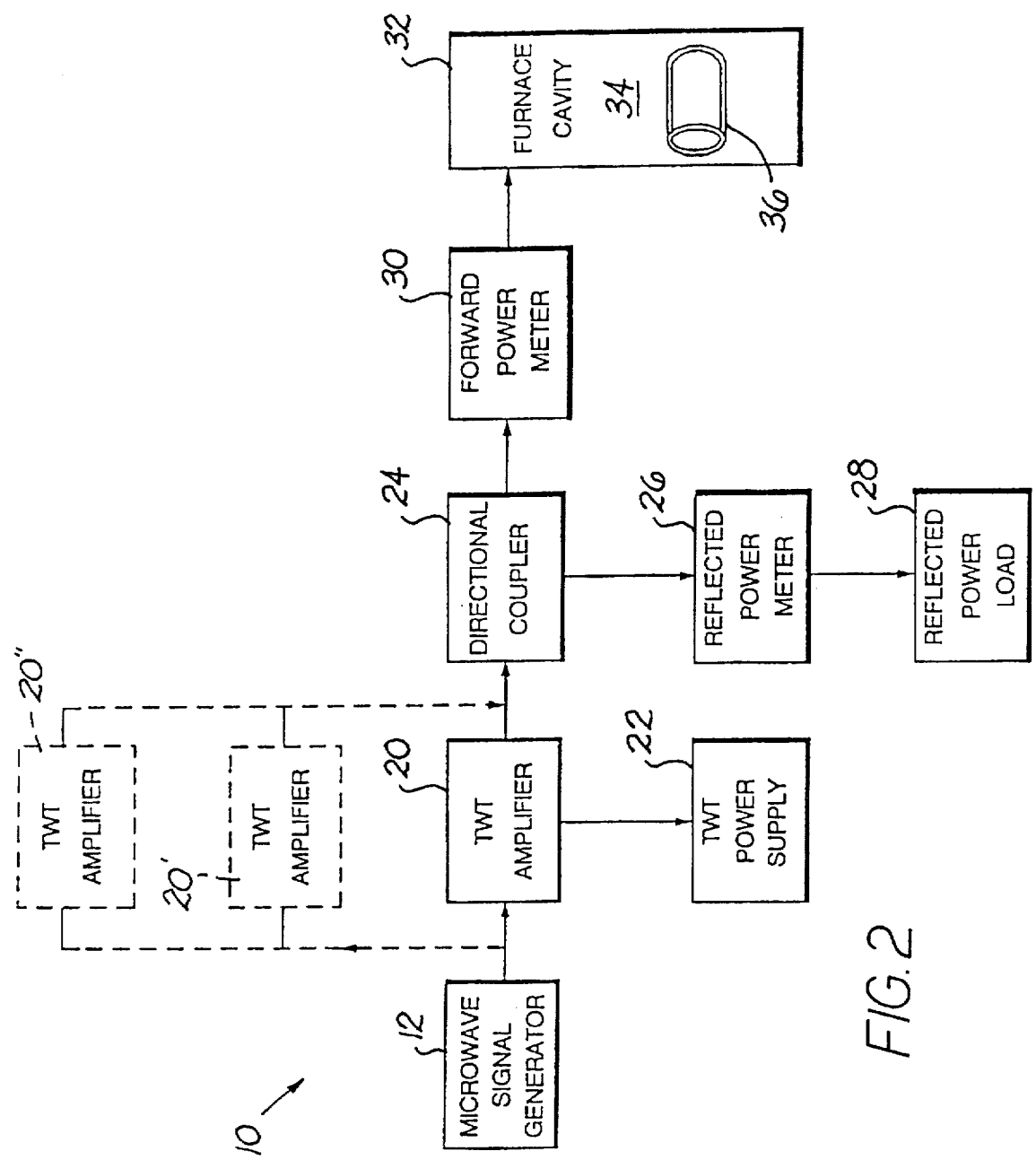
FIG. 2 schematically illustrates another embodiment of a variable frequency microwave heating apparatus, according to the present invention.
Figure 3:
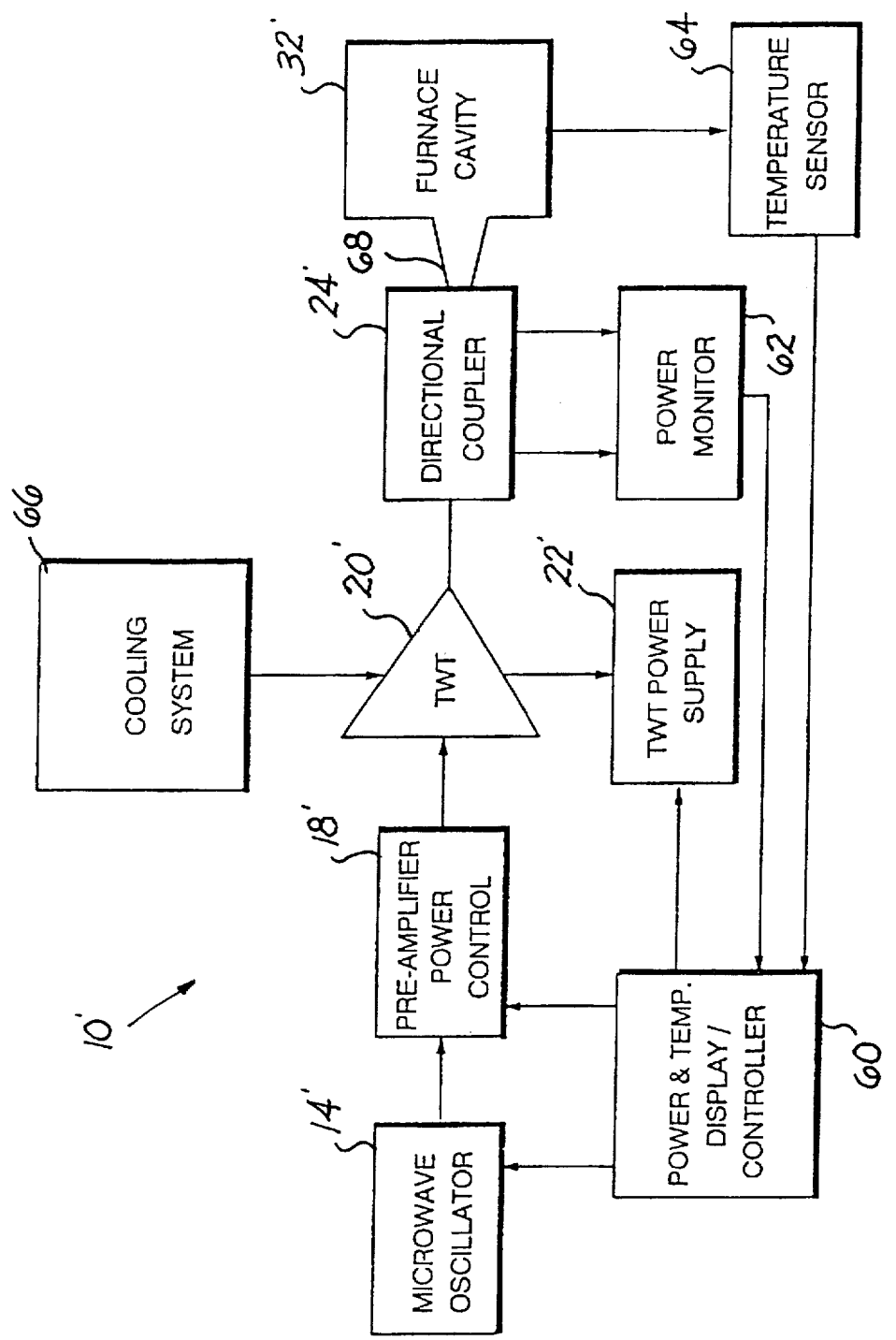
FIG. 3 schematically illustrates another embodiment of a variable frequency microwave heating apparatus, according to the present invention.

Referring now to FIG. 3, another embodiment of a variable frequency microwave heating apparatus, designated as 10' is illustrated. In the illustrated embodiment, a power and temperature display and controller 60 receives input from a power monitor 62 and a temperature sensor 64. The power monitor 62 receives input from the directional coupler 24' and serves the same basic functions as the reflected and forward power meters 26.30 illustrated in FIGS. 1 and 2. The power and temperature display and controller 60 further serves to control the microwave oscillator 14', the pre-amplifier power control 18', and the TWT power, supply 22'. A cooling system 66 is provided for cooling at least the TWT amplifier 20' during operation thereof. Preferably, a tapered wave guide coupler 68 is provided to enhance the efficiency with which the broad band microwave energy is transmitted into the microwave cavity.

As described with respect to the illustrated embodiments of FIGS. 1 and 2, the microwave source of the illustrated embodiment in FIG. 3 may be, but is not limited to, a TWT, a couple-cavity TWT, a ring-loop TWT, a ring-bar TWT, a klystron, a twystron, or a gyrotron. Preferably, the microwave source generates microwave energy with a bandwidth of at least five percent (5%) on either side of a particular frequency.

Table 1 below provides typical characteristics of suitable microwave sources for the illustrated embodiments of FIGS. 1, 2, and 3.

TABLE 1

| Source Type | Frequency Range (GHz) | Bandwidth (%) | Output Power (kW) | | Overall Efficiency (%) |
|---|---|---|---|---|---|
| Ring-loop TWT | 0.5–20 | 5–15 | 1–20 | 0.05–0.6 | 30–45 |
| Ring-bar TWT | 0.5–20 | 10–20 | 3–30 | 0.08–0.9 | 30–45 |
| Coupled-cavity TWT | 0.5–300 | 5–15 | 50–5000 | 1–300 | 40–60 |
| Helix TWT | 0.5–20 | 5–50 | 0.10–3.0 | | 25–35 |
| Klystron | 0.5–70 | 5–8 | 100–8000 1–5000 | | 40–70 |
| Crossed-field Amp | 0.5–20 | 15–40 | 100–3000 1–300 | | 30–50 |

Figure 4:
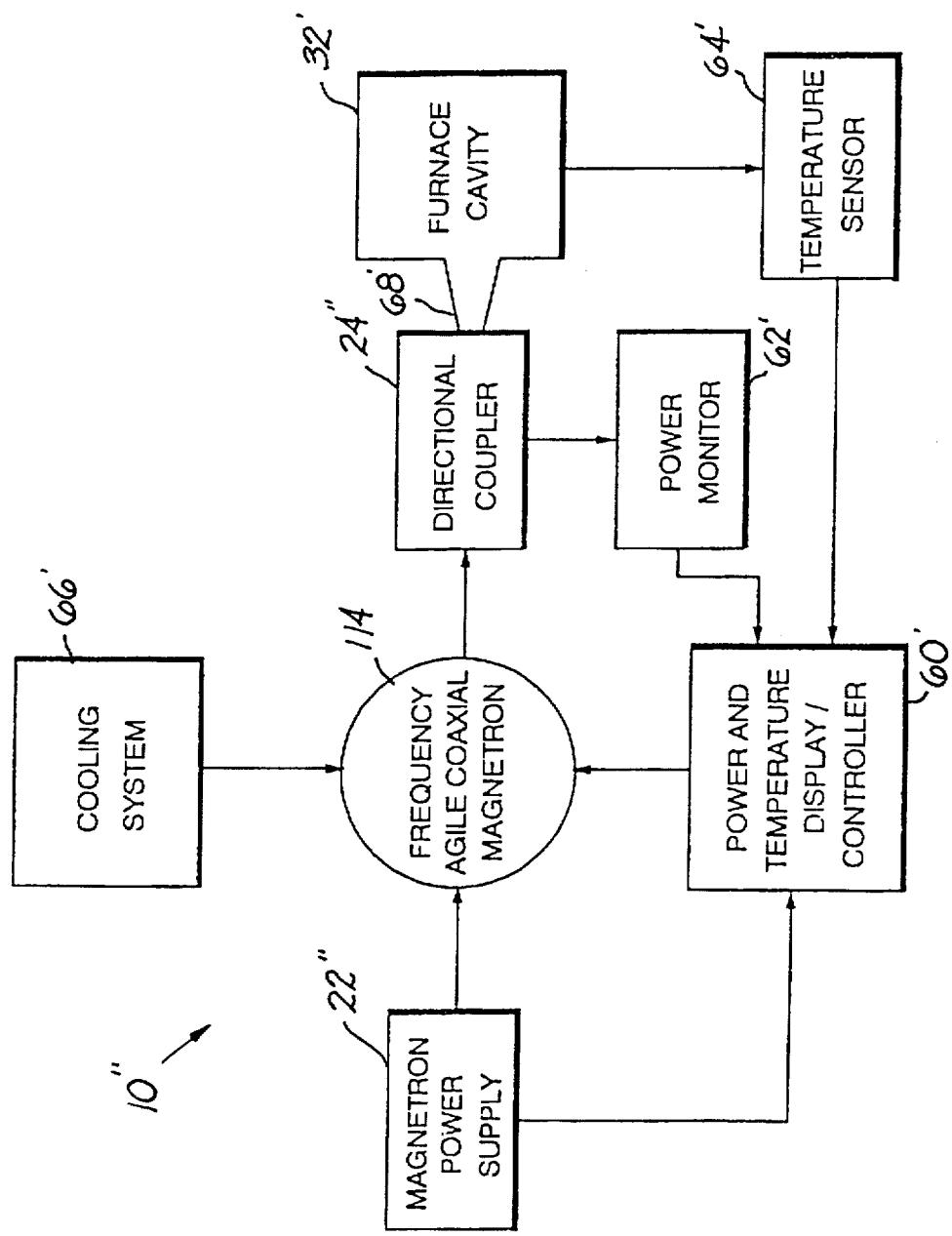
FIG. 4 schematically illustrates another embodiment of a variable frequency microwave heating apparatus, according to the present invention.

Referring now to FIG. 4, another embodiment of a variable frequency microwave heating apparatus, designated as 10" is illustrated. In the illustrated embodiment, a high-power oscillator 114 such as a frequency-agile coaxial magnetron is substituted for the microwave oscillator 14, the pre-amplifier 18 and TWT amplifier 20 of the previously described embodiments illustrated in FIGS. 1, 2, and 3. Preferably, the magnetron 114 has a usable bandwidth of at least 5% on either side of a central frequency. The magnetron 114 is frequency-controlled either manually or, preferably, through a closed-loop, voltage-based feedback control system. In such a feedback control system, a low-level (0 to 10 Volt) signal is used to activate a servo-mechanism in the magnetron 114 which "tunes" the magnetron 114 from one frequency to another by precise repositioning of a plunger plate in the magnetron's coaxial cavity.

Preferably, a tapered transition 68' is provided to enhance the efficiency by which the broad band microwave energy is transmitted into the microwave cavity 32". By acting as an impedance transformer between the transmission line and the microwave cavity 32", the transition 68' increases the percentage power coupled into the cavity. The tapered transition 68' is effective in preventing the formation of plasma discharges at the input window when reactive gases are present by reducing the power density of the microwave energy at the interface between the window and any reactive gases present.

Figure 5:
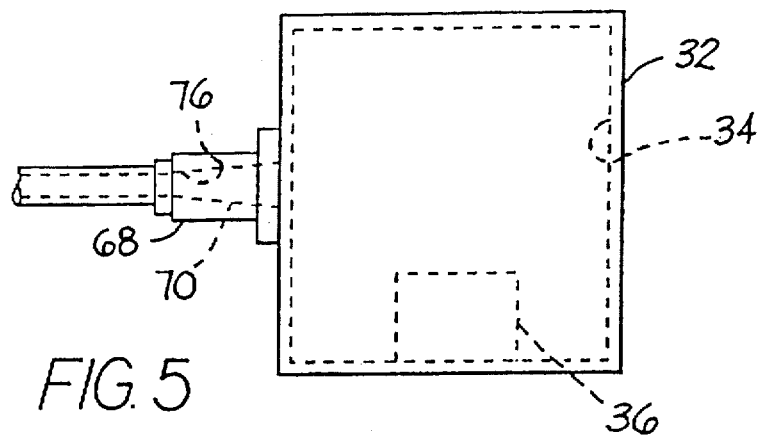
FIG. 5 is a section view of a microwave furnace and wave guide applicator constructed in accordance with several features of the present invention wherein a workpiece is shown being cured in a batch-wise manner.

Referring now to FIG. 5, a batch process for processing workpieces 36, such as a polymeric article, is illustrated. Microwaves from a variable frequency microwave generator are introduced into the multi-mode cavity 34 through a wave guide applicator 68. As would be known by skilled artisans, the microwave cavity 34 may also contain molds, tooling, or other fixtures to support and/or constrain the workpiece 36. A batch might comprise a single workpiece 36 or any number of similar workpieces placed in the cavity simultaneously.

Figure 6:
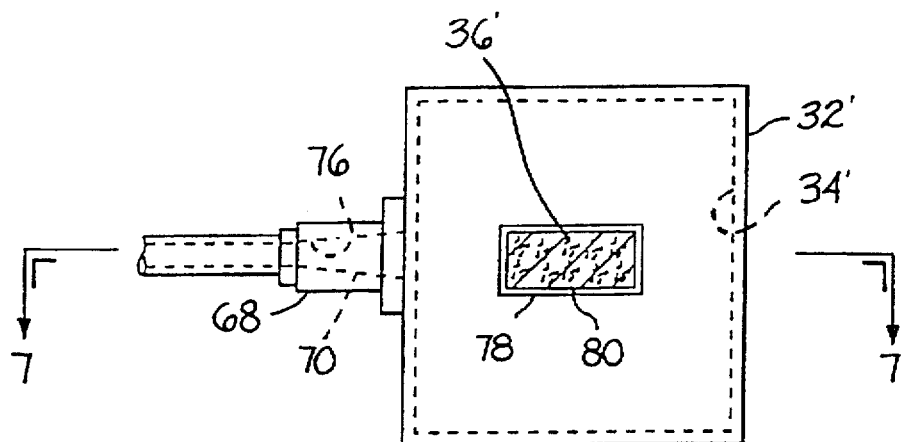
FIG. 6 is a section view of a microwave furnace and wave guide applicator constructed in accordance with several features of the present invention wherein a continuous workpiece is being cured while being fed through openings therein.
Figure 7:
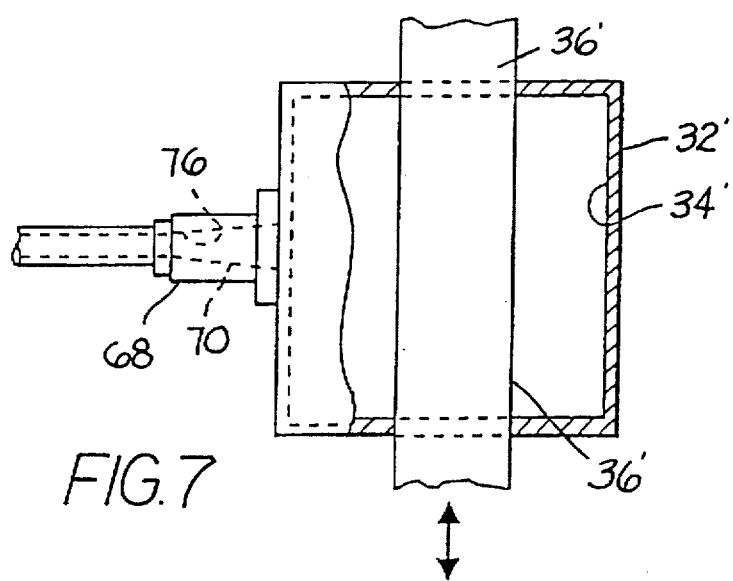
FIG. 7 is a plan view, partially in section, of the microwave furnace, wave guide, and continuous workpiece of FIG. 6, taken along lines 7—7 thereof.

Referring now to FIGS. 6 and 7, a multi-mode microwave furnace, according to the present invention, may be configured to process a workpiece 36' comprising a generally continuous film, sheet, or web. To accommodate continuous processing, the microwave furnace 32' has openings 78 in opposing sides thereof to permit the workpiece 36' to pass there through in either direction as indicated. Microwave energy from the microwave signal generator is introduced into the multi-mode cavity 34' through a wave guide 68. A sealing device 80 may be provided to minimize leakage of microwave radiation through the openings 78. Exemplary sealing devices 80 may include baffles, chokes, or any combination of these and/or other conventional sealing devices.

Figure 8:
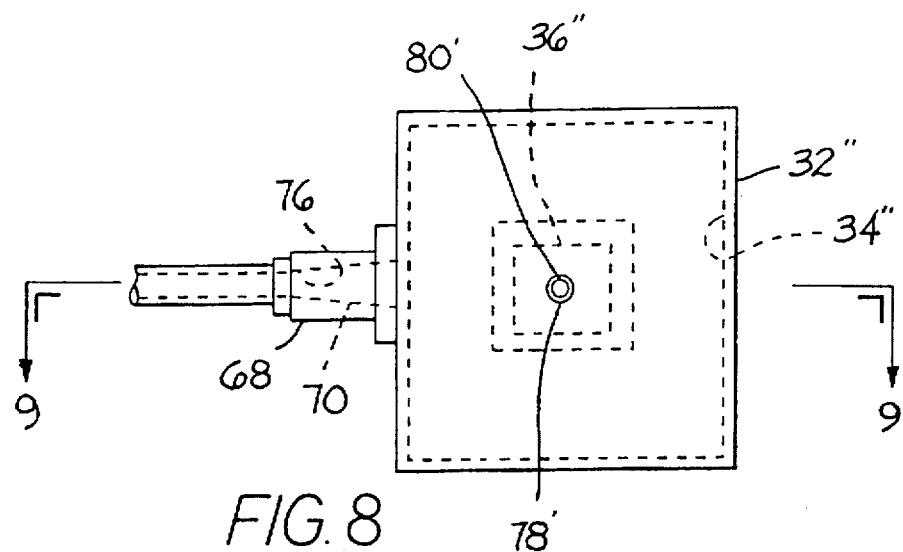
FIG. 8 is a section view of a microwave furnace and wave guide applicator constructed in accordance with several features of the present invention wherein a workpiece is being cured while being compressed.
Figure 9:
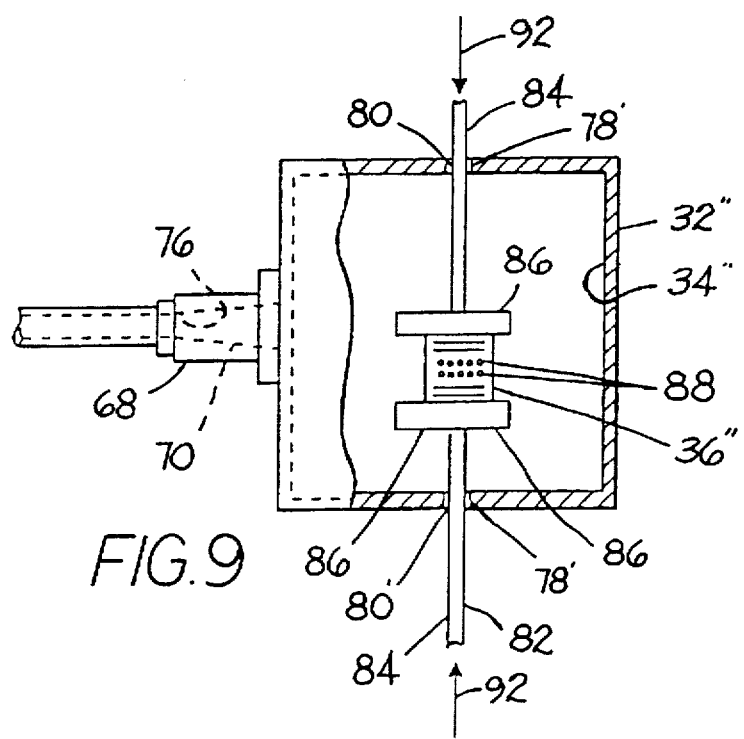
FIG. 9 is a plan view, partially in section, of the microwave furnace, wave guide, workpiece, and compressor of FIG. 8, taken along lines 9—9 thereof.

Referring now to FIGS. 8 and 9, a multi-mode microwave furnace 32" according to the present invention, may be configured to cure a workpiece 36" having an adhesive bond 88 securing multiple laminae together. The curing of adhesively bonded laminae and other components often requires a compressing device 82 for applying a compressive load to the workpiece 36" to insure adequate bonding and to maintain density. The workpiece 36", containing the adhesive 88, is placed within the multi-mode microwave cavity 34". A compressive load, as indicated by the arrows 92, is applied through pushrods 84 and platens 86 to the components being joined together via the adhesive 88. Microwave energy from a microwave signal generator is then introduced into the microwave cavity 34" through the wave guide 68.

Figure 10:
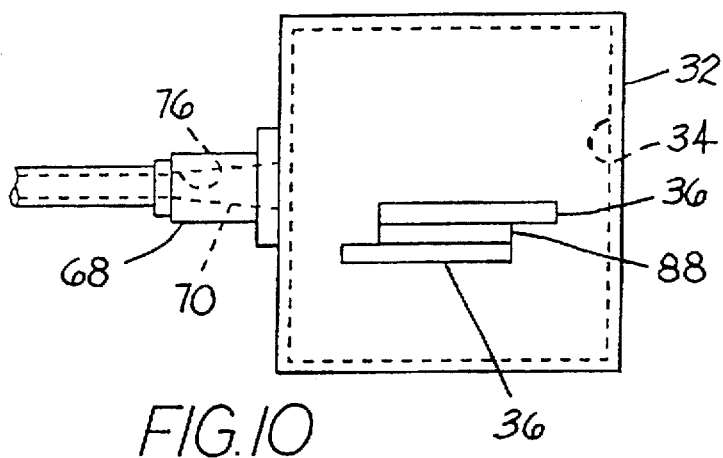
FIG. 10 illustrates adhesive bonding according to one aspect of the present invention.

The pushrods 84 and platens 86 are preferably constructed of microwave-transparent materials such as glass or ceramics. Preferably, the workpiece 36" illustrated in FIG. 9 has at least one adhesive layer 88 which is exposed to microwave energy along at least one edge of the workpiece. It will be appreciated that any number of components can be used in the method of the present invention and that one component or assembly can contain any desired number of adhesive bonds to be cured. In addition, as illustrated in FIG. 10, components 36 may be bonded together by curing adhesive 88 sandwiched therebetween via microwave energy without the use of compressive devices.

Figure 11:
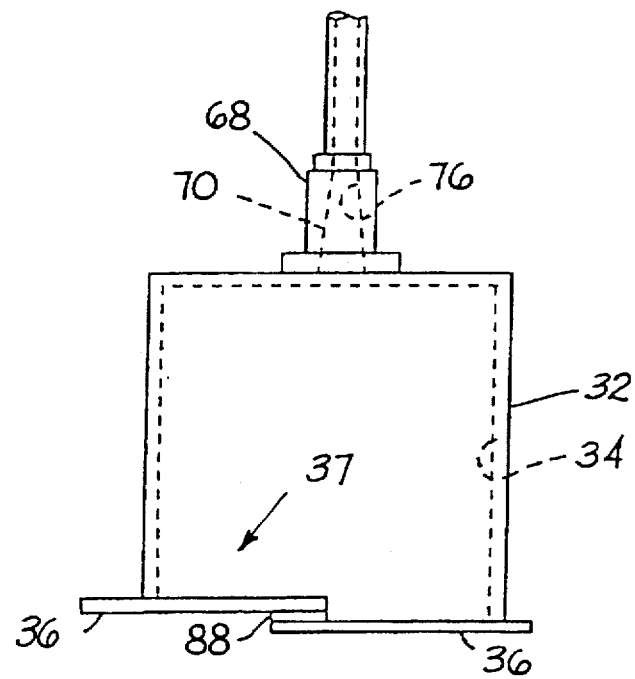
FIG. 11 illustrates adhesive bonding according to another aspect of the present invention.

Referring now to FIG. 11, another configuration of a multi-mode microwave furnace 32, according to the present invention, is illustrated. In the illustrated embodiment, an open-sided microwave cavity 34 permits the furnace to be placed on top of a workpiece 36 to be processed. The advantage of this configuration, is that the furnace 32 can be used in an assembly line 37 wherein workpieces 36 are continuously passed thereunder for processing as well as in situations where the workpiece is very large (e.g., bonding the skin of an aircraft).

The efficiency of a variable frequency microwave heating apparatus, according to the present invention, is illustrated in the following examples. However, the present invention is not limited to the embodiments in these examples. In each of the following examples, an air-cooled variable frequency microwave heating apparatus having an air-cooled helix TWT and a tapered wave guide applicator was used. A 13"×13"×10" rectangular microwave cavity was used, in which microwave power was coupled efficiently over the frequency range from 2.5 to 7.5 GHz. Tests using thermally sensitive paper demonstrated that frequency sweeping was highly effective at creating a uniform power density throughout the cavity.

EXAMPLE 1

The microwave cavity was used to cure a six inch (6") diameter sample disk of epoxy resin |ERL-2258 resin from Union Carbide and M-phenylene diamine hardener from DuPont|. Both the frequency range and the sweep rate were reduced in order to determine the minimal range necessary for adequate mode stirring. It was determined that a twenty percent (20%) bandwidth was sufficient to produce uniform microwave heating. The twenty percent (20%) bandwidth was particularly sufficient to produce uniform heating in samples in which high thermal conductivity assisted in bringing minor spatial variations into equilibrium.

It will be appreciated by those skilled in the art that the actual bandwidth required to achieve uniform curing is dependent on various factors, including the size and shape of the microwave cavity and the average microwave frequency used. For example, a 12"×12"×10" rectangular cavity will support over six hundred (600) possible closely-spaced resonant modes over the frequency range from 4 to 6 GHz. Thus, a bandwidth of as little as five percent (5%) of a central frequency can provide sufficient mode plurality to achieve relatively uniform curing results.

EXAMPLE 2

Aluminum Foil-Covered Polyurethane

One layer of aluminum foil was placed over 1"×3"× 0.125" thick glass-reinforced polyurethane test coupons. A proprietary epoxy-based adhesive from B. F. Goodrich was spread over a ½" area on one end of a coupon. Glass beads (0.030" dia.) were placed on the adhesive to provide spacing such that a uniform 0.030" thick layer of adhesive was placed on each sample.

Samples were processed at 5.03±1 GHz, sweeping once per 100 millisecond (msec) with approximately 150 Watts of forward power (reflected power averaged about 24 Watts of forward power (reflected power averaged about 24 Watts during the cure cycle). The coupons were exposed to microwave radiation for 35 minutes each. All were fully and evenly cured and had joined the substrate materials. No arcing was observed within the furnace cavity nor within the adhesive bond.

EXAMPLE 3

Copper-Clad Circuits Boards

Copper-clad circuit boards, approx. 6"×6", clad on both sides with a continuous copper layer, were bonded using a commercially available modified nitrile epoxy adhesive in sheet form, such as FM-73 from Cytec. The adhesive, which is pressure sensitive, was placed on one board and then a roller was used to apply even pressure over the surface of the adhesive to insure good contact with the substrate. The second board was then placed on top of the adhesive and the roller technique was again used to guarantee an even placement of the adhesive.

Samples were processed at 5.03±1 GHz, sweeping once per 100 msec with approximately 150 Watts of forward power (reflected power averaged about 24 Watts during the cure cycle). The assembly was exposed to microwave radiation for 35 minutes. The adhesive was fully cured and had formed a strong bond between the two copper-clad boards. This result is surprising in view of the large area of the parts and the small thickness of the adhesive bond, through which the microwaves propagated in an edgewise fashion. Because the boards were clad on both sides, the example rules out the possibility that heat was generated in the boards and conducted through to heat the adhesive indirectly; thus, edgewise propagation of microwave energy into the adhesive layer is demonstrated. No arcing was observed within the furnace cavity nor within the adhesive bond.

It will be appreciated by those skilled in the art that the term "curing" as used herein includes any thermally-assisted polymer treatment, such as polymerization, cross-linking, vulcanization, melting, drying, or the removal of other volatile species. Bonding can employ a thermoplastic adhesive that is fully or partially melted and then resolidifies to form the polymeric bond layer. It will be further appreciated that many thermoplastic polymers, such as polyethylene, have a very low loss tangent and are therefore difficult to heat by direct microwave absorption. The ability to heat these materials quickly can be enhanced by mixing any number of lossy materials, preferably in powdered form, with the adhesive. Finely divided metals, metal oxides, metal carbides, and carbon black are particularly suitable for this use.

Figure 12:
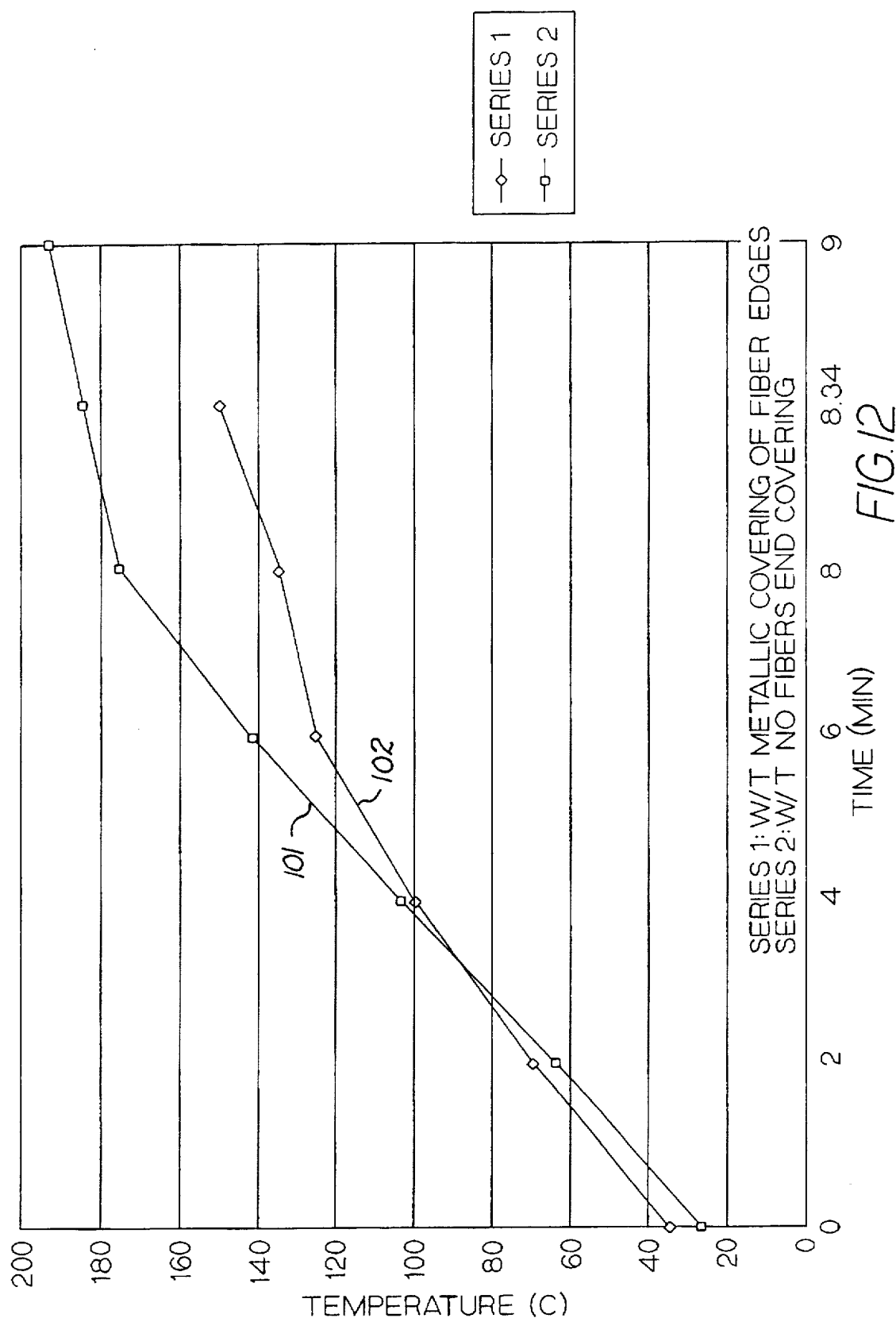
FIG. 12 illustrates the "edge effect" of edgewise penetration of microwave energy into a cross-ply composite.

According to another aspect of the present invention, polymeric materials comprising multiple carbon fiber reinforced laminae can be successfully cured. For example, a 24-ply carbon fiber reinforced composite having adjacent plies configured so that the direction of fibers in one ply is rotated about ninety degrees (90°) from the direction of fibers in an adjacent ply, can be cured efficiently and effectively. Heretofore, composites comprising multidirectional fibers could not be adequately cured. The microwave radiation was effectively blocked by layers containing fibers oriented so as not to match the polarization of the microwave beam. In the inventive process, the microwave energy enters the workpiece at the edges and propagates parallel to the conductive fiber plies. Thus, each ply acts as a miniature wave guide to carry the microwave energy into the interior of the workpiece. This surprising phenomenon referred to hereinafter as the "edge effect" was verified by covering just the edge of a multidirectional carbon-fiber laminate with copper tape to prevent the entry of microwave energy. The composite was not heated efficiently with the edges covered. The experimental results are shown in FIG. 12, where it can be seen that the uncovered sample (curve indicated by 101) reached a temperature of 180° C., whereas the sample with its edges covered (curve indicated by 102) only reached 150° C. In FIG. 12, temperature in degrees Celsius is plotted along the "y" axis, and time is plotted along the "x" axis.

Further experimentation using a low-power variable frequency microwave source and a network analyzer illustrated that a cross-ply composite of carbon fibers effectively blocked the penetration of most microwave power normal to the composite surface, yet when small strips of unidirectional carbon fiber composite were placed along the edge of the larger sample, and the proper frequency range was selected, these small strips could effectively direct microwave power into the composite sample in an edgewise fashion.

The effectiveness of variable-frequency microwave heating can therefore be attributed, in part, to the great number of microwave modes excited within the processing cavity, which not only improves the power uniformity within the cavity, but also improves the likelihood that one or more modes will exist that can favorably enter one or more edges of the workpiece.

When the surface of continuous graphite fiber reinforced epoxy composites are exposed to microwave energy, the following can be observed: 1) microwaves cannot penetrate easily through crossply graphite fiber epoxy composites, 2) microwaves cannot penetrate efficiently through unidirectional graphite fiber epoxy composites when the electric field is parallel to the fiber direction, and 3) microwave energy at 2.45 GHz can penetrate through multiple layers of graphite fiber epoxy composites when the electric field is perpendicular to the fiber direction. When the ends of the fibers are exposed to microwaves, the fiber behave like "antennas" to generate electrical current inside the exposed fibers. Therefore, both unidirectional and crossply graphite fiber composites can be processed, using microwave energy, if the appropriate electric field can be excited along the ends of the fibers.

The following examples illustrate the effects of fiber orientation versus electric field orientation.

EXAMPLE 4

Flat panels of glass reinforced polymer matrix composites and flat panels of continuous graphite fiber reinforced polymer matrix composites were used. A network analyzer was connected to a coaxial line which in turn was coupled to a microwave launcher. A microwave signal was launched by the network analyzer and transmitted through the coaxial line to a waveguide adapter which was connected to a broadband launcher. The launcher configuration was such that the electric field is forced out in to free space and/or into a microwave cavity with a given orientation (i.e., parallel to the height of the double ridge wave guide). Flat panels were placed in front of the microwave launcher and microwave reflections back to the network analyzer were detected.

Figure 13:
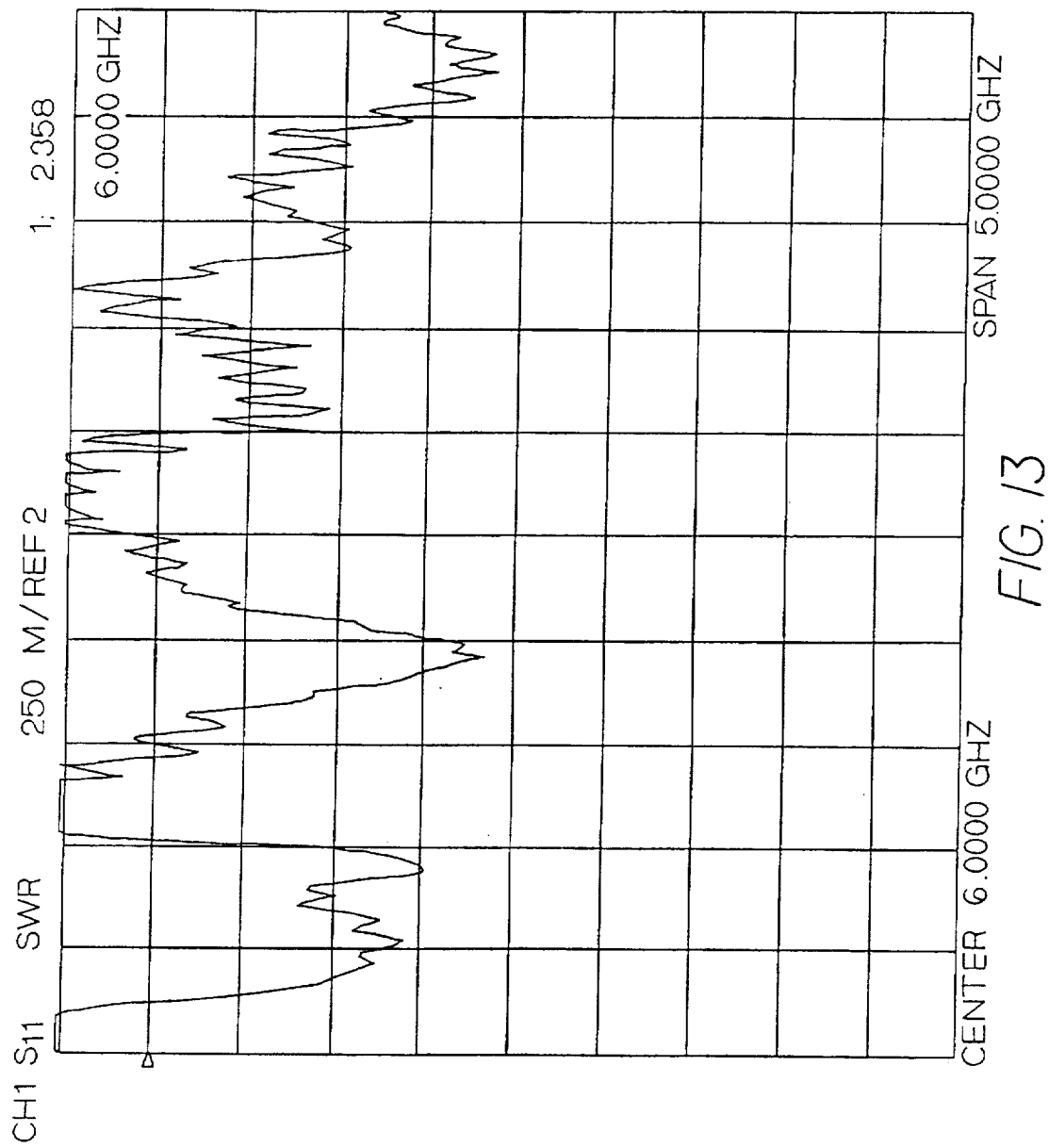
FIGS. 13–17 illustrate microwave energy transmission for various composite panels with various conductive fiber orientations.

The reflected microwave energy was studied as a function of frequency and orientation of the fibers of the unidirectional composite panel. The study was conducted at various frequencies to evaluate the effect of frequency on the reflection and/or transmission of microwave energy by the composite flat panels. FIG. 13 illustrates the transmission of microwave energy for a glass reinforced polymer matrix composite flat panel, for a plurality of frequencies within 5 GHz frequency bandwidth centered around 6 GHz. The electric field is oriented randomly with respect to the fibers. As illustrated by FIG. 13, most of the frequencies are transmitted within the material.

Figure 14:
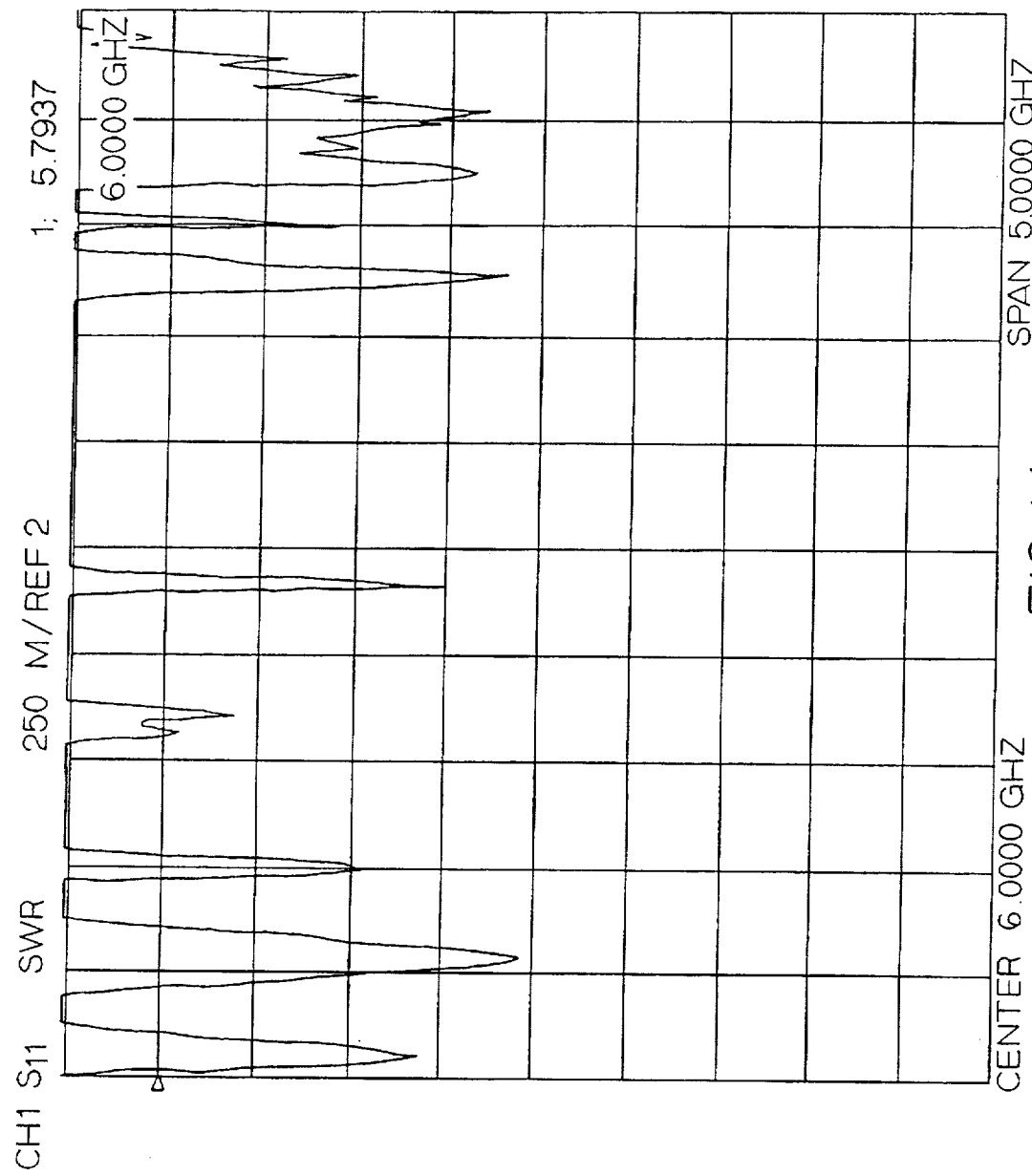
Figure 15:
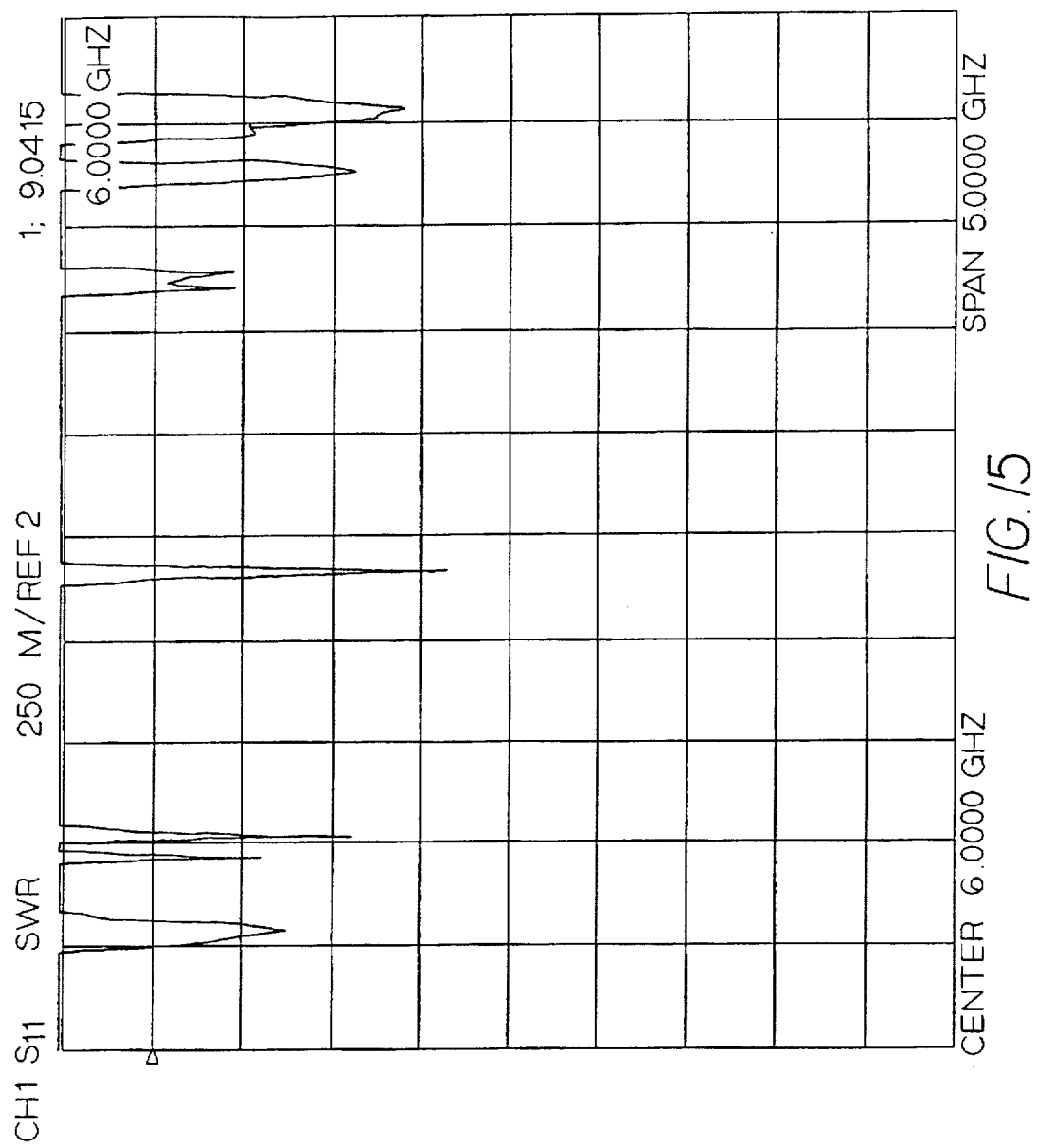
Figure 16:
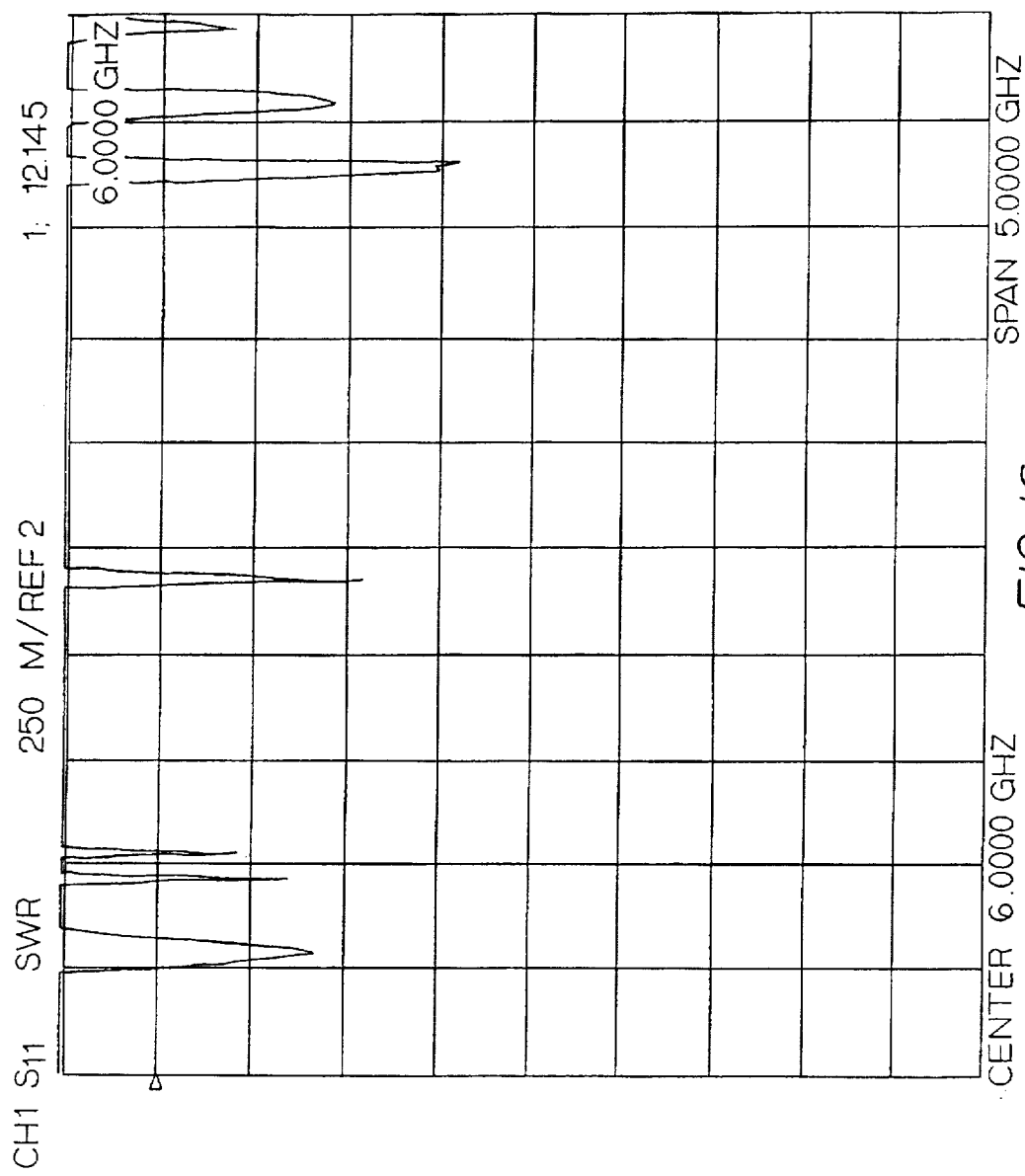
Figure 17:
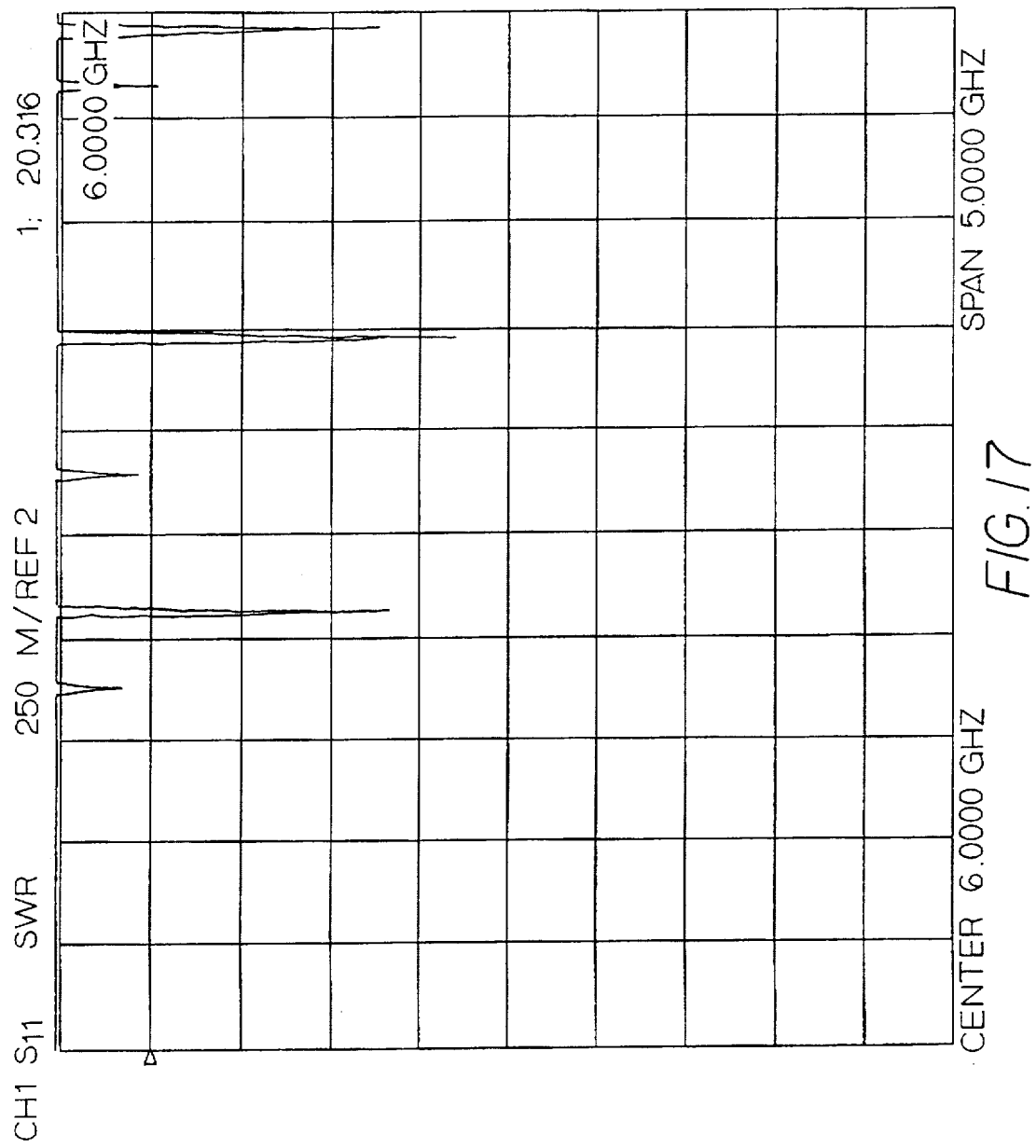

FIGS. 14–16 illustrate the transmission of microwave energy for a graphite fiber reinforced composite flat panel, for a plurality of frequencies within a 5 GHz frequency bandwidth centered around 6 GHz. FIG. 17 illustrates the transmission of microwave energy for a crossply graphite fiber reinforced composite flat panel having alternating plies of fibers with orientations of 0° and 90°, respectively, for a plurality of frequencies within a 5 GHz frequency bandwidth centered around 6 GHz.

EXAMPLE 5

FIG. 14 illustrates how microwave energy at some frequencies is not reflected when the electric field is perpendicular to the fiber orientation. Several frequencies within the bandwidth of frequencies, 5 GHz frequency bandwidth centered around 6 GHz, are transmitted through the material, as is clearly illustrated.

EXAMPLE 6

FIG. 15 illustrates how the electric field is transmitted through the composite flat panel when the electric field is at an angle of 45° angle with respect to the fiber orientation. More frequencies are being reflected as compared with FIG. 14 in the previous example.

EXAMPLE 7

FIG. 16 illustrates how a lesser number of frequencies are being transmitted through the panel when the electric field is parallel to the fiber orientation.

EXAMPLE 8

FIG. 17 illustrates how an even fewer number of frequencies within the 5 GHz frequency bandwidth centered around 6 GHz are being transmitted by the material in the case of a crossply composite.

As shown above in Examples 4 through 8, the glass reinforced composite examples allowed the transmission of the entire frequency band (5 GHz frequency bandwidth centered around 6 GHz) while the continuous graphite fiber reinforced composite progressively halted the transmission of microwave energy with fiber orientation. The correlation observed is that for continuous graphite fiber composite samples with fibers oriented perpendicular to the electric field, more transmission is observed as compared with composite samples having fibers forming a 45° and/or a 0° angle with the electric field. Furthermore, for crossply composites consisting of plies having fiber orientation of 0° and 90°, the transmission was minimal when compared with the case where the electric field and the fibers were perpendicular to each other.

Figure 18A:
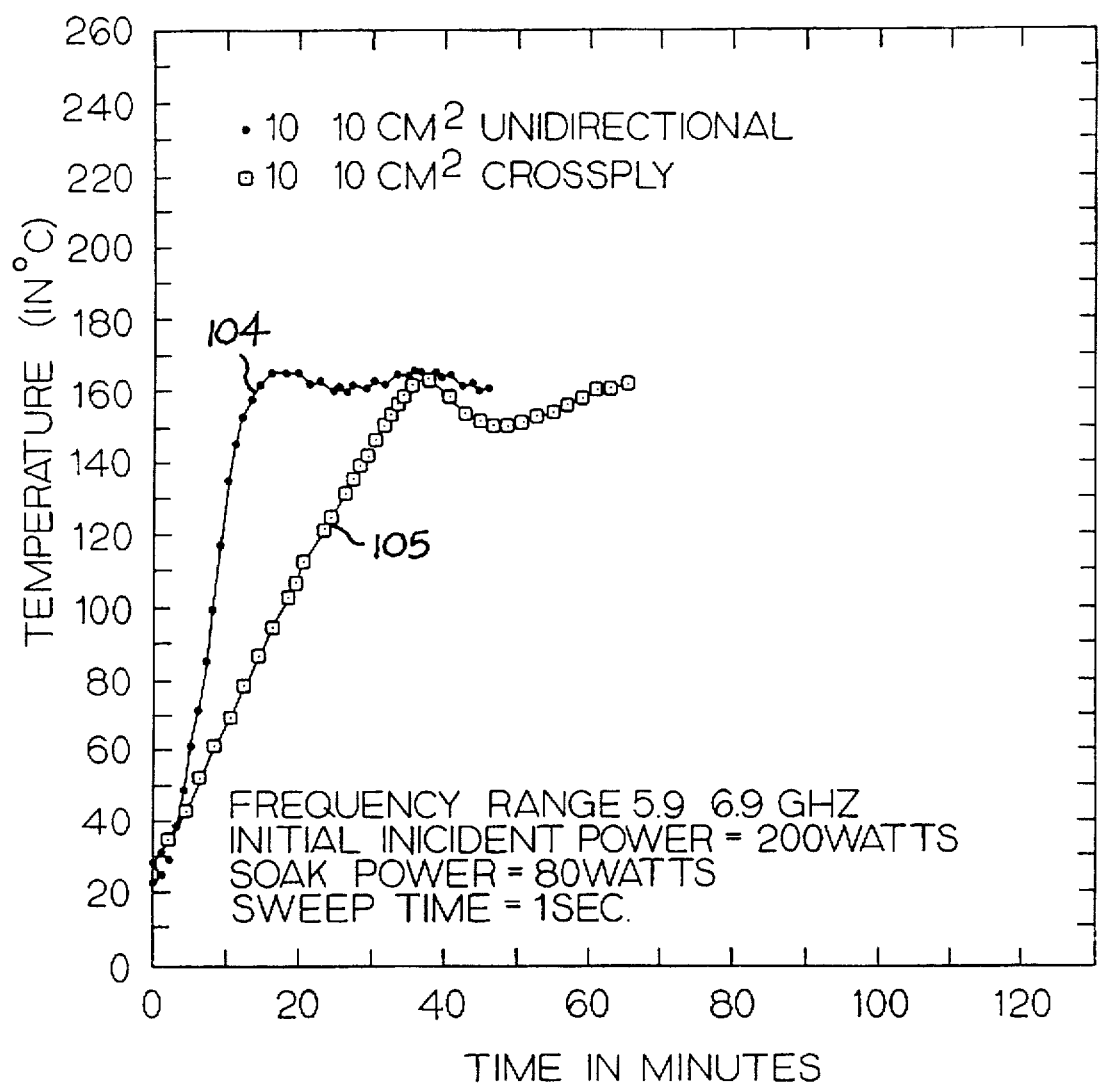
FIGS. 18a and 18b illustrate thermal profiles during microwave heating of various composite panels with various conductive fiber orientations.
Figure 18B:
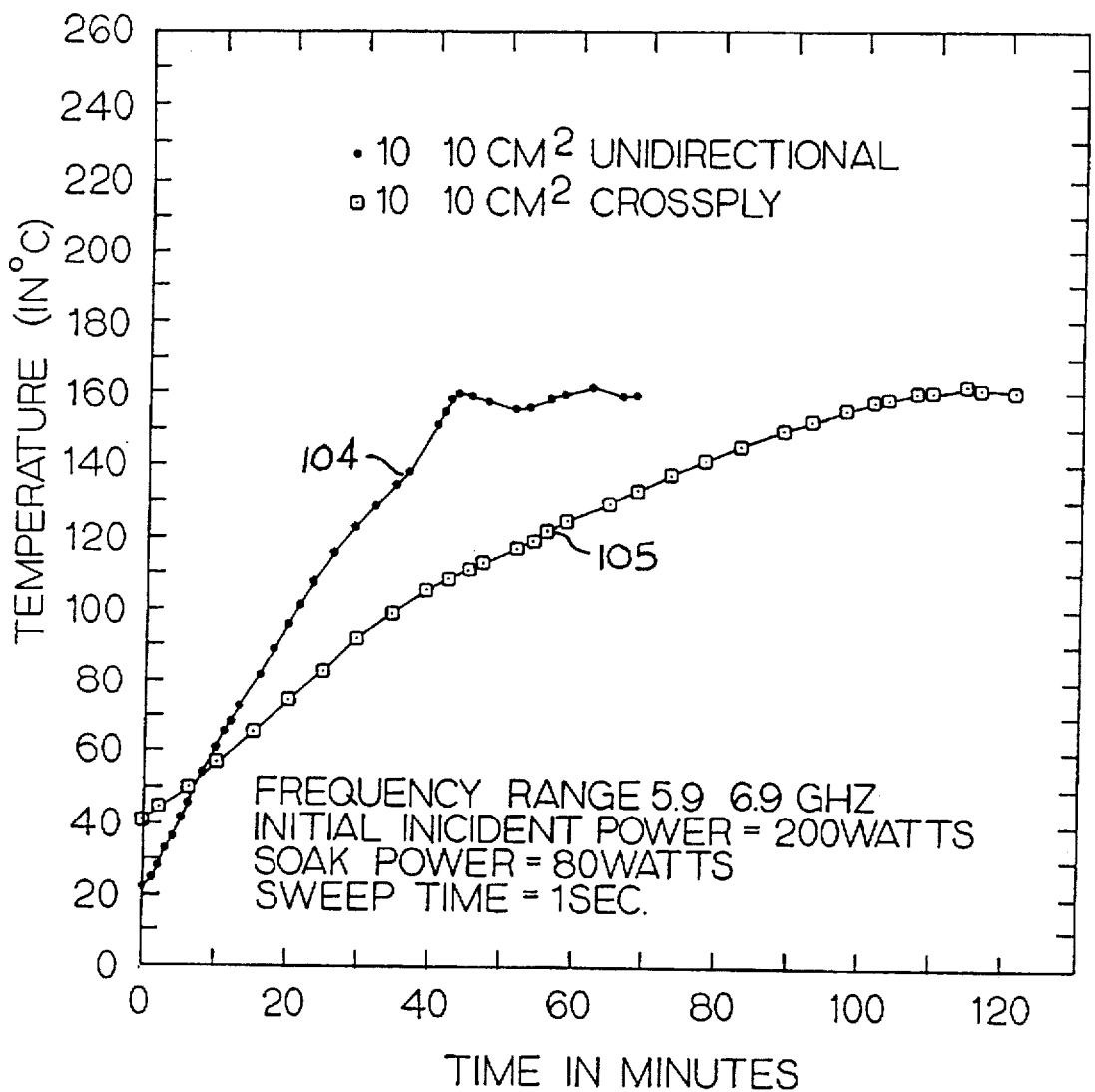

The effect of fiber orientation on the heating profile of both unidirectional and cross ply flat composite panels will now be described. The heating rate was obtained during the processing in a multimode cavity of two types of flat graphite reinforced composite samples, of the same dimension, shape, number of plies (32) and mass under identical conditions of frequency, bandwidth, sweeprate, and power. One sample had unidirectional fiber orientation while the other sample had crossply fiber orientation. Referring now to FIGS. 18a and 18b, it can be seen that the unidirectional sample heats more rapidly than the crossply sample. Less microwave penetration is allowed when the electric field is impinging on the samples with its orientation parallel to the fibers (indicated by curve 104). The crossply samples (indicated by curve 105), in which fiber orientation is random, are most likely to stop microwave energy. However, heating still occurs through the ends of the various fibers. In FIGS. 18a and 18b, temperature in degrees Celsius is plotted along the "y" axis, and time in minutes is plotted along the "x" axis.

Figure 19:
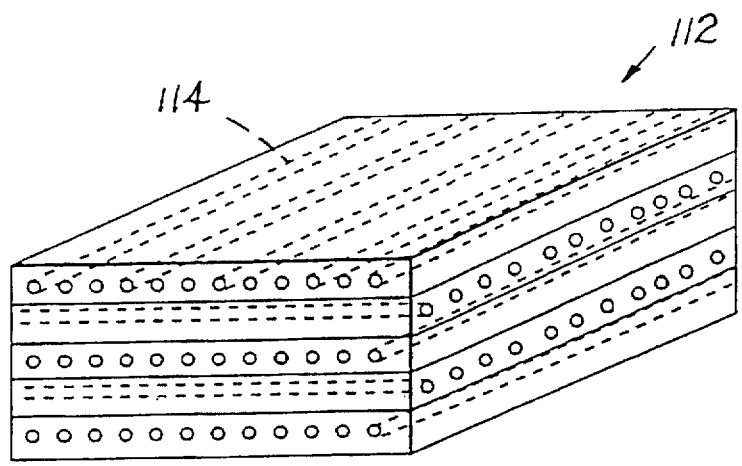
FIG. 19 is a section view of a composite article comprising multiple polymeric substrates with unidirectional fibers therein.
Figure 20:
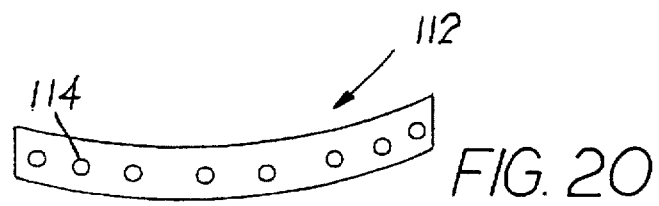
FIG. 20 illustrates warping of a polymeric substrate having unidirectional fibers therein.
Figure 21:
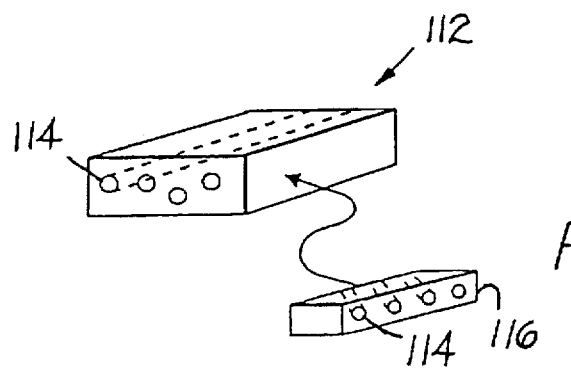
FIG. 21 illustrates placing a strip having unidirectional fibers therein along an edge of a composite article according to the present invention.

Referring now to FIGS. 19 through 21, several 20-ply, three inch by three inch (3"×3") unidirectional graphite fiber composites 112 having multi-directional fiber orientation (FIG. 19) were heated using microwaves at various frequencies from 4 to 10 GHz. Most samples warped in the direction perpendicular to the fibers 114 as illustrated in FIG. 20.

Figure 23:
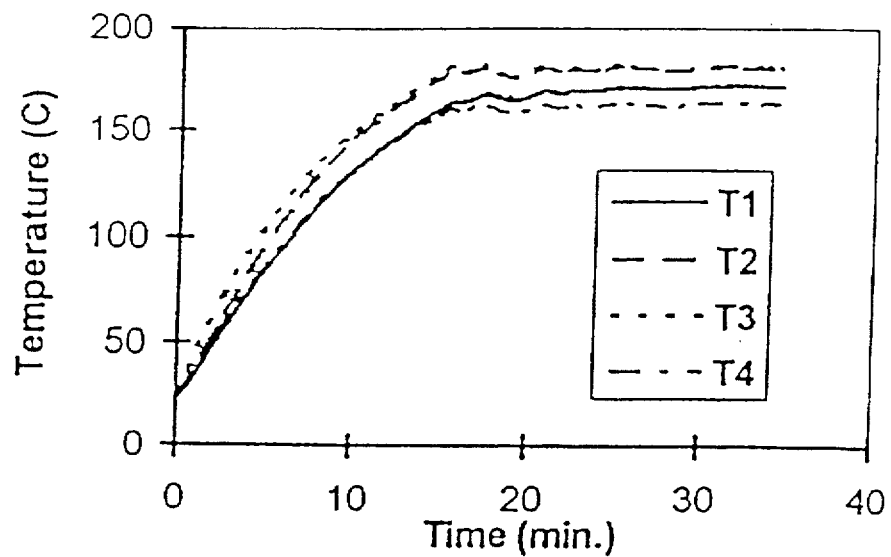
FIG. 23 is a thermal profile during microwave heating of graphite fiber/epoxy composites with strips along its edges according to the present invention.
Figure 22:
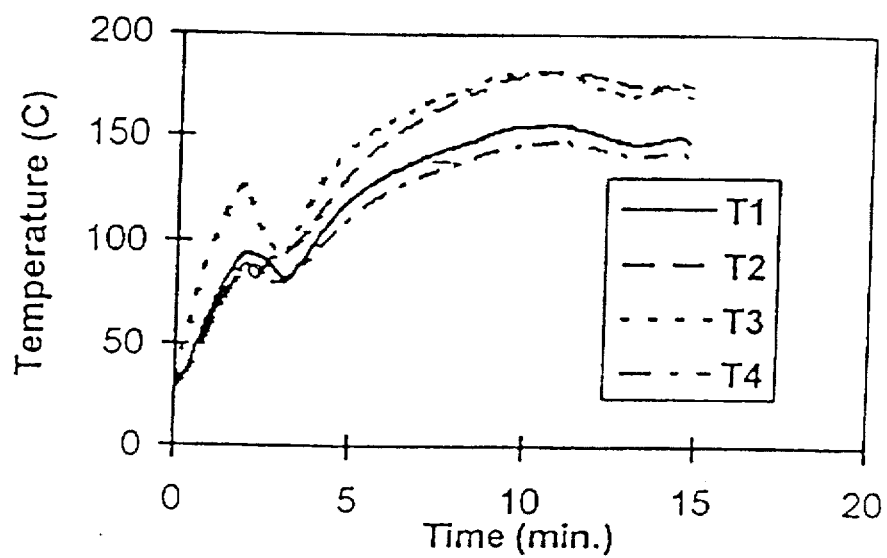
FIG. 22 is a thermal profile during microwave heating of graphite fiber/epoxy composites without strips along its edges.

The warping is due to the fact that the heat loss on the composite sides that are parallel to the fibers is much greater than the heat loss at the composite sides that are perpendicular to the fiber sides. The uneven heat loss is caused by the fact that most heating is generated through the ends of the fibers rather than throughout the material. To correct for this uneven heat loss, unidirectional graphite fiber composite strips 116 were placed on the sides of composites 112 as shown in the FIG. 21. Sufficient heat was generated by the composite strips 116 and the composite samples 112 no longer warped upon the application of microwave energy. The temperature profiles generated within these samples 112 are illustrated in FIGS. 22 and 23. As illustrated by FIG. 22 the temperature across the samples are higher near the fiber ends as compared to temperatures measured along the axis of the fiber. FIG. 23 illustrates how the unidirectional fiber strips, when perpendicularly adjusted along the fibers' direction of the flat panel unidirectional composite, provide heating from the sides which leads to a uniform temperature profile across the sample surfaces. In FIGS. 22 and 23, temperature in degrees Celsius is plotted along the "y" axis, and time in minutes is plotted along the "x" axis. The various temperatures illustrated were measured at different locations within the sample. As illustrated in FIG. 22, the temperatures monitored at the sides perpendicular to fiber direction of the samples are greater than those monitored at the sample sides parallel with fiber direction.

Figure 25:
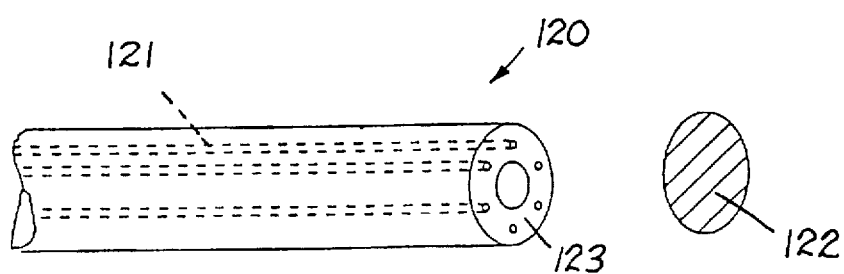
FIG. 25 illustrates shielding the exposed end portions of fibers in an article according to the present invention.
Figure 24:
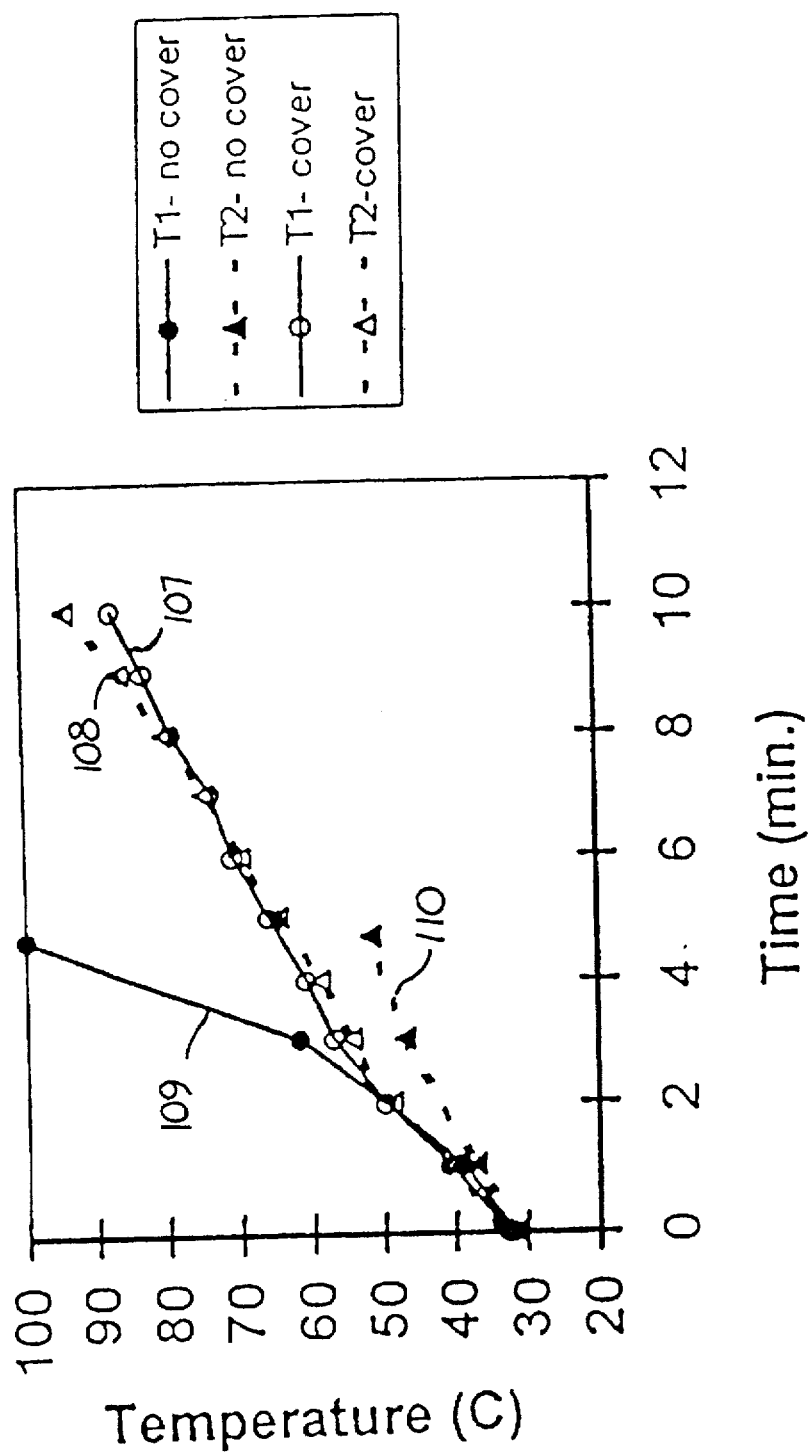
FIG. 24 illustrates the thermal profile during microwave heating of a hose having conductive fibers therein, with and without shielding at the end.

Another example of the edge effect, illustrated in FIG. 25, involves the microwave heating of rubber enveloping wire-braided hollow cylinders, as in the case of tubing, hoses and the like. A hose 120 is shown with conductive fibers 121 therein in a generally unidirectional orientation, and exposed at one end 123 of the hose. When the wire ends were not properly covered or shielded, via shield 122, from microwaves, most of the microwave energy was coupled to the wire ends. The rubber at the end 123 melted, reflecting temperatures in excess of 180° C. However, the temperatures for the rubber enveloping the middle section of the wire braids was less than 60° C. Only when the ends of the wire braid/rubber assembly were covered with metallic caps and/or metallic tapes, thus shielding the ends from microwave energy, was the assembly heated uniformly. FIG. 24 illustrates the temperatures profiles generated at the edge and at the middle of the samples when the ends are shielded (indicated by curves 107,108) versus when the ends are not covered (indicated by curves 109,110). In FIG. 24, temperature in degrees Celsius is plotted along the "y" axis, and time in minutes is plotted along the "x" axis.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of uniformly heating a first substrate, said first substrate having a plurality of first conductive fibers disposed therein in a first direction and having an edge portion generally parallel with said first direction, said method comprising the steps of:

positioning a second substrate edge portion in contacting relation with said first substrate edge portion, said second substrate having a plurality of second conductive fibers disposed therein in a second direction and extending between said second substrate contacting edge portion and a second substrate non-contacting edge portion, said second substrate positioned such that said second fibers are substantially perpendicular to said first fibers; and sweeping said first and second substrates with variable frequency microwave energy such that one or more microwave modes enters said second substrate non-contacting edge portion to facilitate uniformly heating said first substrate.

2. A method according to claim 1, wherein said first substrate is formed of polymeric material.

3. A method according to claim 1, wherein said second substrate is formed of polymeric material.

4. A method according to claim 1, wherein said first fibers are graphite fibers.

5. A method according to claim 1, wherein said second fibers are graphite fibers.

6. A method of uniformly heating an article having a plurality of conductive fibers disposed therein, said fibers having an end portion exposed along a portion of said article, said method comprising the steps of:

shielding said exposed fiber end portions with microwave impermeable material; and sweeping said article with variable frequency microwave energy to uniformly heat said article.

7. A method according to claim 6, wherein said article is formed of polymeric material.

8. A method according to claim 6, wherein said fibers are graphite fibers.

9. A method according to claim 6, wherein said microwave impermeable material is metallic.

10. A method of uniformly heating a composite article comprising first and second layers, said first layer having a plurality of first conductive fibers disposed therein in a first direction and exposed along a first edge portion in said first layer, said second layer having a plurality of second conductive fibers disposed therein in a second direction and exposed along a second edge portion in said second layer, said second direction substantially transverse to said first direction, said article having at least one edge portion substantially perpendicular to said second direction, said method comprising sweeping said composite article with variable frequency microwave energy such that one or more microwave modes enters said second layer at said at least one edge portion substantially perpendicular to said second direction to generate an electric field substantially perpendicular to said second direction.

11. A method according to claim 10, wherein said layers are formed of polymeric material.

12. A method according to claim 10, wherein said first fibers are graphite fibers.

13. A method according to claim 10, wherein said second fibers are graphite fibers.

* * * * *